(12) United States Patent
Park et al.

(10) Patent No.: US 11,871,642 B2
(45) Date of Patent: Jan. 9, 2024

(54) ORGANIC LIGHT EMITTING DIODE PANELS AND DISPLAY DEVICES INCLUDING THE SAME

(71) Applicant: Samsung Electronics Co., Ltd., Suwon-si (KR)

(72) Inventors: Kyung Bae Park, Hwaseong-si (KR); Kwang Hee Lee, Hwaseong-si (KR); Chul Joon Heo, Busan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 83 days.

(21) Appl. No.: 17/587,295

(22) Filed: Jan. 28, 2022

(65) Prior Publication Data
US 2022/0157902 A1     May 19, 2022

Related U.S. Application Data

(63) Continuation of application No. 16/225,747, filed on Dec. 19, 2018, now Pat. No. 11,239,286.

(30) Foreign Application Priority Data

Sep. 12, 2018    (KR) .................. 10-2018-0108794

(51) Int. Cl.
    *H10K 59/60*       (2023.01)
    *H10K 50/818*      (2023.01)
    (Continued)

(52) U.S. Cl.
    CPC .......... *H10K 59/60* (2023.02); *H10K 50/818* (2023.02); *H10K 50/828* (2023.02);
    (Continued)

(58) Field of Classification Search
    CPC ..................................... H10K 59/60
    See application file for complete search history.

(56) References Cited

U.S. PATENT DOCUMENTS 6,708,268 B1    3/2004   Boles et al.
7,203,818 B2    4/2007   Boles et al.
(Continued)

FOREIGN PATENT DOCUMENTS

EP        3355299 A2    8/2018
JP    2007-124601 A    5/2007
(Continued)

OTHER PUBLICATIONS

Korean Office Action dated Feb. 21, 2023 for corresponding Korean Application No. 10-2018-0108794, and English-language translation thereof.

(Continued)

*Primary Examiner* — Marvin Payen
(74) *Attorney, Agent, or Firm* — Harness, Dickey & Pierce, P.L.C.

(57) ABSTRACT

An OLED panel for implementing biometric recognition influencing an aperture ratio of an OLED light emitter i includes a substrate, an OLED on the substrate, and a driver on the substrate. The OLED may emit visible light, and the driver may drive the OLED. The driver may include a visible light sensor configured to detect the visible light emitted by the OLED, and the visible light sensor may overlap the OLED in a direction that is substantially perpendicular to an upper surface of the substrate. The OLED panel may include a near infrared ray OLED that is configured to emit near infrared rays, and the driver may include a near infrared ray sensor configured to detect near infrared rays emitted by the near infrared ray OLED. The near infrared ray sensor may overlap the OLED in a direction that is substantially perpendicular to an upper surface of the substrate.

20 Claims, 22 Drawing Sheets

(51) Int. Cl.
*H10K 59/126* (2023.01)
*G06V 40/19* (2022.01)
*G06V 40/16* (2022.01)
*H10K 50/828* (2023.01)
H01L 27/146 (2006.01)
G06V 40/13 (2022.01)
H10K 102/00 (2023.01)

(52) U.S. Cl.
CPC ....... *H10K 59/126* (2023.02); *G06V 40/1318* (2022.01); *G06V 40/166* (2022.01); *G06V 40/19* (2022.01); H01L 27/14678 (2013.01); H10K 2102/3026 (2023.02)

(56) References Cited

U.S. PATENT DOCUMENTS

| | | | |
|---|---|---|---|
| 7,206,924 | B2 | 4/2007 | Boles et al. |
| 10,381,485 | B2 | 8/2019 | Kang et al. |
| 10,707,351 | B2 | 7/2020 | Kang et al. |
| 11,411,115 | B2 | 8/2022 | Kang et al. |
| 2004/0075637 | A1 | 4/2004 | Izumi |
| 2004/0195572 | A1 | 10/2004 | Kato et al. |
| 2008/0054275 | A1 | 3/2008 | Vogel et al. |
| 2008/0061678 | A1 | 3/2008 | Hamano et al. |
| 2015/0331508 | A1 | 11/2015 | Nho et al. |
| 2017/0110522 | A1 | 4/2017 | Lee et al. |
| 2018/0032778 | A1 | 2/2018 | Lang |
| 2018/0212060 | A1 | 7/2018 | Kang et al. |
| 2019/0319133 | A1 | 10/2019 | Kang et al. |
| 2020/0279952 | A1 | 9/2020 | Kang et al. |
| 2022/0344515 | A1 | 10/2022 | Kang et al. |

FOREIGN PATENT DOCUMENTS

| | | |
|---|---|---|
| KR | 2006-0117953 A | 11/2006 |
| KR | 10-0841244 B1 | 6/2008 |
| KR | 2015-0120043 A | 10/2015 |
| KR | 10-1721132 B1 | 3/2017 |
| KR | 10-2018-0088099 A | 8/2018 |

OTHER PUBLICATIONS

Extended European Search Report dated Oct. 24, 2019 for corresponding European Application No. 19164413.7.

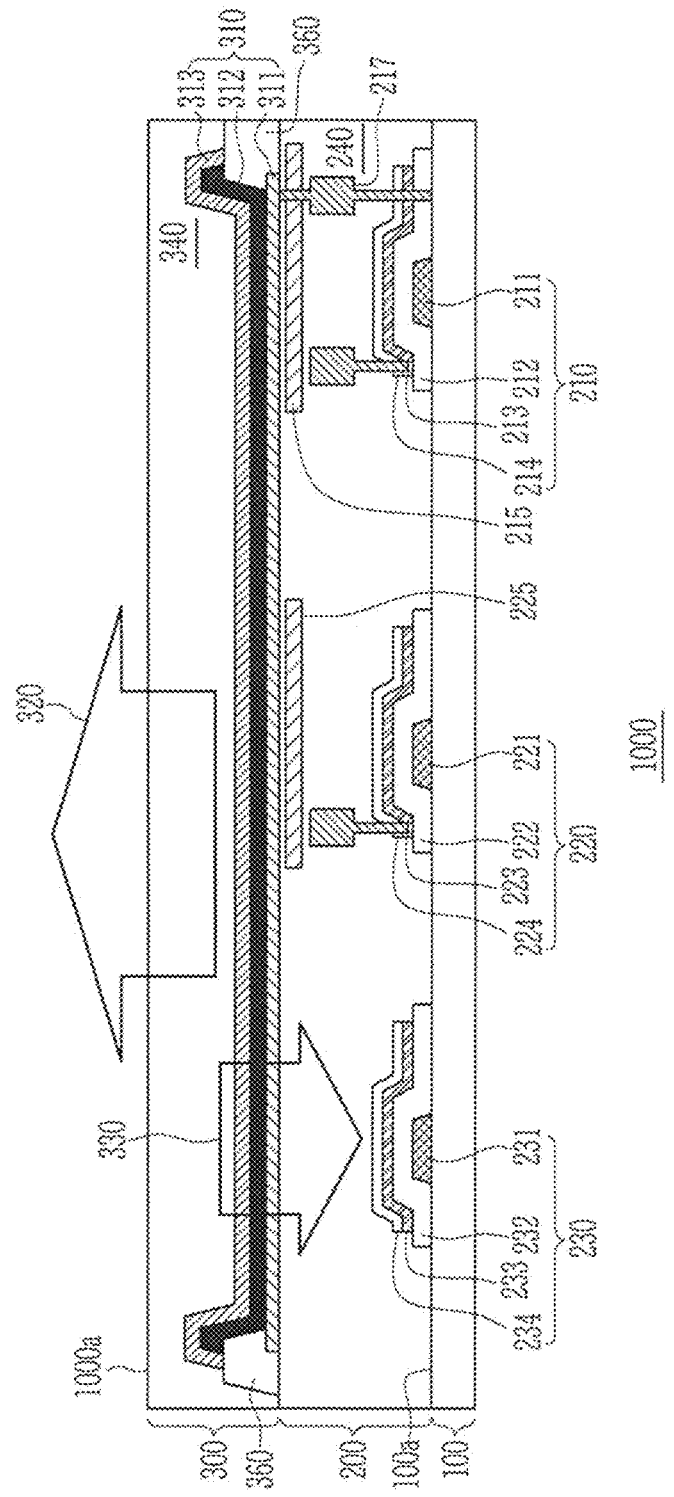

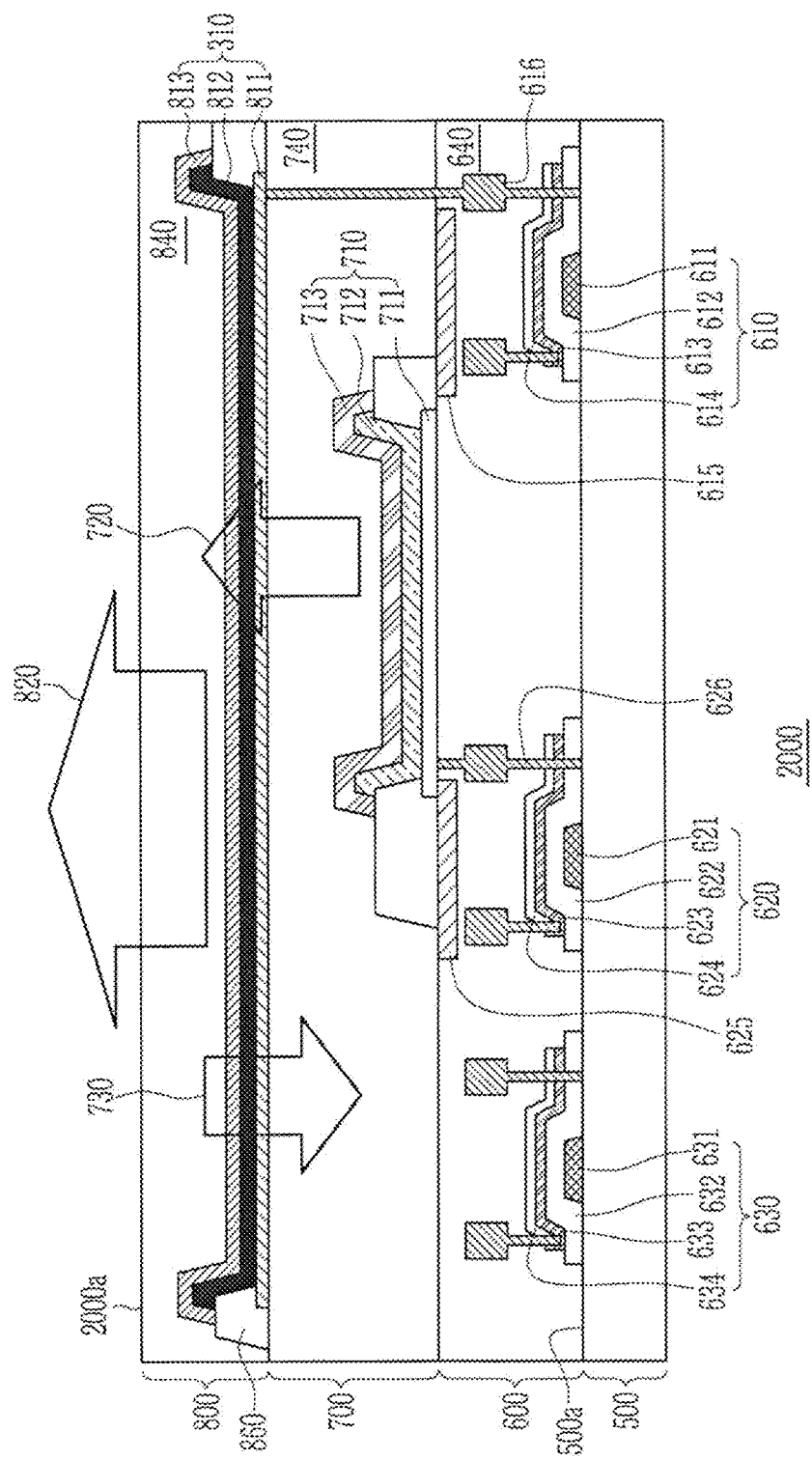

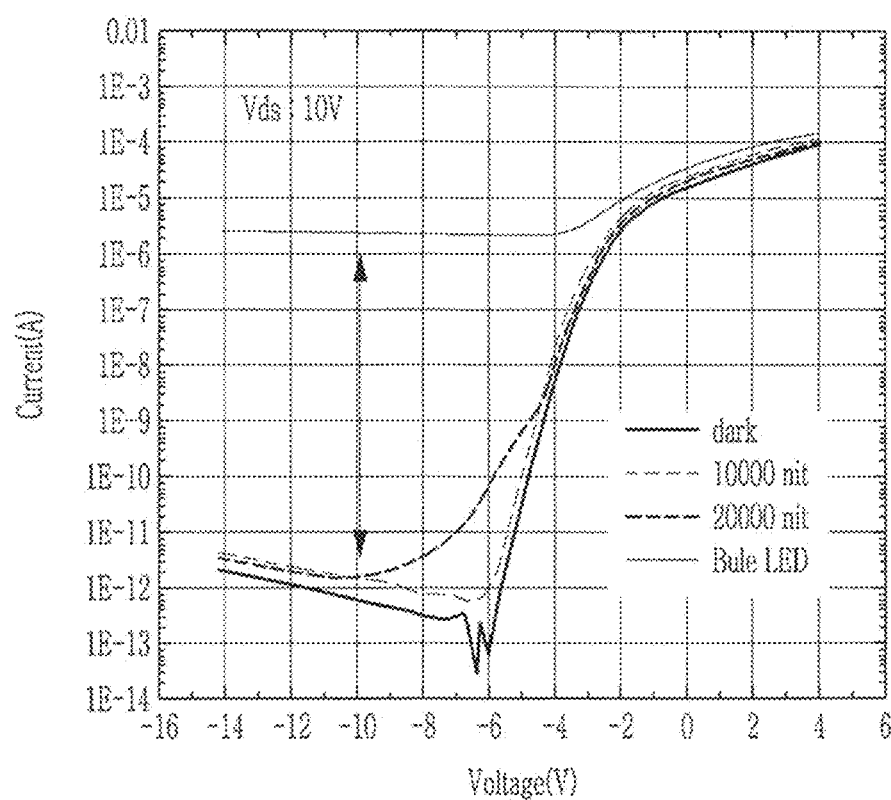

ORGANIC LIGHT EMITTING DIODE PANELS AND DISPLAY DEVICES INCLUDING THE SAME

CROSS-REFERENCE TO RELATED APPLICATIONS

This application is a continuation of U.S. application Ser. No. 16/225,747, filed Dec. 19, 2018, which claims priority to and the benefit of, under 35 U.S.C. § 119, Korean Patent Application No. 10-2018-0108794 filed in the Korean Intellectual Property Office on Sep. 12, 2018, the entire contents of each of which are incorporated herein by reference.

BACKGROUND

(a) Field

The present inventive concepts relate to OLED panel and a display device including the same. More particularly, the present inventive concepts relate to OLED panels including one or more photosensors configured to implement biometric recognition, and one or more display devices including the same.

(b) Description of the Related Art

Organic light emitting diode (OLED) display devices may have excellent luminance, driving voltage, and response speed characteristics and may realize color images as merits, so they are applicable to various display devices.

Recently, demands are increasing for display devices to be configured to implement biometric recognition of human being via one or more biometric techniques for certifying a user by extracting specific biometric data or behavioral feature information of human beings. Such biometric recognition may be implemented by use of automated devices and/or may be implemented with a focus on finance, health care, mobile systems. Particularly, leading smartphone companies are focusing on adapting fingerprint and iris recognition technologies.

After Apple has taken over AuthenTech, a manufacturer of semiconductor fingerprint recognizing sensors, it continues mounting the fingerprint recognizing sensors on electronic devices, including iPhone® and iPad® electronic devices. US2015-0331508 also discloses a technique for forming a sensor for fingerprint recognition.

However, regarding US2015-0331508, the aperture ratio of the OLED light emitter reduces compared to the existing OLED light emitter without a fingerprint recognizing sensor. The reduction of the aperture ratio of the OLED light emitter may substantially influence the displaying characteristic in the mobile display device particularly such as smartphones with small display areas.

The above information disclosed in this Background section is only for enhancement of understanding of the background of the invention and therefore it may contain information that does not form the prior art that is already known in this country to a person of ordinary skill in the art.

SUMMARY

Some example embodiments of the present inventive concepts provide one or more OLED panels configured to implement biometric recognition without influencing an aperture ratio of an OLED light emitter.

Some example embodiments of the present inventive concepts provide one or more display device including an OLED panel that is configured to implement biometric recognition and further to not influence an aperture ratio of an OLED light emitter of the OLED panel.

According to some example embodiments, an organic light emitting diode (OLED) panel may include a substrate, an OLED on the substrate, the OLED configured to emit visible light, and a driver between the substrate and the OLED, the driver configured to drive the OLED. The driver may include a visible light sensor configured to detect the visible light emitted by the OLED. The visible light sensor may overlap the OLED in a direction that is substantially perpendicular to an upper surface of the substrate.

The driver may further include an OLED driving transistor and an OLED switching transistor. The OLED driving transistor may be configured to drive the OLED. The visible light sensor, the OLED driving transistor, and the OLED switching transistor may be on a same plane.

The OLED panel may further include a black shield configured to block the visible light emitted by the OLED. The black shield may be between the OLED switching transistor and the OLED, between the OLED driving transistor and the OLED, or a combination thereof.

The visible light emitted by the OLED may include red light, green light, and blue light. The visible light sensor may be configured to selectively detect the blue light.

The OLED may include a first electrode and a second electrode. The first electrode may include a reflecting electrode. The second electrode may include a transparent electrode or a semi-transparent electrode.

According to some example embodiments, an organic light emitting diode (OLED) panel may include a substrate, an OLED on the substrate, the OLED configured to emit visible light, a near infrared ray OLED on the substrate, the near infrared ray OLED configured to emit near infrared rays, and a driver between the substrate and the OLED. The driver may further be between the substrate and the near infrared ray OLED. The driver may be configured to drive both the OLED and the near infrared ray OLED. The driver may include a near infrared ray sensor configured to detect near infrared rays emitted by the near infrared ray OLED. The near infrared ray sensor may overlap the OLED in a direction that is substantially perpendicular to an upper surface of the substrate.

The driver may include an OLED driving transistor configured to drive the OLED. The driver may include a near infrared ray driving transistor configured to drive the near infrared ray OLED. The near infrared ray sensor, the OLED driving transistor, and the near infrared ray driving transistor may be on a same plane.

The OLED panel may further include a black shield configured to block near infrared rays emitted by the near infrared ray OLED. The black shield may be between the OLED driving transistor and the OLED, between the near infrared ray driving transistor and the near infrared ray OLED, or a combination thereof.

The OLED may include a first electrode and a second electrode. The first electrode may include a reflecting electrode. The second electrode may include a transparent electrode or a semi-transparent electrode.

The near infrared ray sensor, the OLED driving transistor, the near infrared ray driving transistor, and the near infrared ray OLED may be on a same plane.

According to some example embodiments, an organic light emitting diode (OLED) panel may include a pixel including a plurality of sub-pixels. Each sub-pixel of the plurality of sub-pixels may include a substrate, an OLED on the substrate, the OLED configured to emit visible light, and a driver between the substrate and the OLED, the driver configured to drive the OLED. A driver of at least one sub-pixel of the plurality of sub-pixels may include a visible light sensor configured to detect the visible light emitted by at least one OLED of the plurality of sub-pixels. The visible light sensor may overlap the OLED of the at least one sub-pixel in a direction that is substantially perpendicular to an upper surface of the substrate.

The driver of the at least one sub-pixel may further include an OLED driving transistor and an OLED switching transistor. The OLED driving transistor may be configured to drive the OLED. The visible light sensor, the OLED driving transistor, and the OLED switching transistor may be on a same plane.

The OLED panel may include a black shield configured to block light emitted by the OLED of the at least one sub-pixel. The black shield may be between the OLED switching transistor and the OLED of the at least one sub-pixel, between the OLED driving transistor and the OLED of the at least one sub-pixel, or a combination thereof.

The plurality of sub-pixels may each be configured to emit red light, green light, or blue light, such that the plurality of sub-pixels collectively emit the red light, the green light, and the blue light. The visible light sensor of the at least one sub-pixel may be configured to selectively detect the blue light.

The OLED of each sub-pixel may include a first electrode and a second electrode. The first electrode may include a reflecting electrode. The second electrode may include a transparent electrode or a semi-transparent electrode.

According to some example embodiments, an organic light emitting diode (OLED) panel may include a pixel including a plurality of sub-pixels. Each sub-pixel of the plurality of sub-pixels may include a substrate, an OLED on the substrate, the OLED configured to emit visible light, and a driver between the substrate and the OLED, the driver configured to drive the OLED. At least one sub-pixel of the plurality of sub-pixels may further include a near infrared ray OLED. The near infrared ray OLED may be configured to emit near infrared rays. A driver of at least one sub-pixel of the plurality of sub-pixels may include a near infrared ray sensor configured to detect the near infrared rays emitted by the near infrared ray OLED. The near infrared ray sensor may overlap the OLED of the at least one sub-pixel that includes the near infrared ray sensor in a direction that is substantially perpendicular to an upper surface of the substrate.

The near infrared ray OLED and the near infrared ray sensor may be included in a common at least one sub-pixel. The driver of the common at least one sub-pixel may include an OLED driving transistor configured to drive the OLED of the common at least one sub-pixel. The driver may include a near infrared ray driving transistor configured to drive the near infrared ray OLED of the common at least one sub-pixel. The near infrared ray sensor, the OLED driving transistor, and the near infrared ray driving transistor of the common at least one sub-pixel may be on a same plane.

The OLED panel may further include a black shield configured to block near infrared rays emitted by the near infrared ray OLED. The black shield may be between the OLED driving transistor and the OLED, between the near infrared ray driving transistor and the near infrared ray OLED, or a combination thereof.

The OLED may include a first electrode and a second electrode. The first electrode may include a reflecting electrode. The second electrode may include a transparent electrode or a semi-transparent electrode.

According to some example embodiments, an organic light emitting diode (OLED) panel may include a substrate, an OLED on the substrate, the OLED configured to emit visible light, and a driver on the OLED, the driver configured to drive the OLED. The driver may include a visible light sensor configured to detect light emitted by the OLED. The visible light sensor may overlap the OLED in a direction that is substantially perpendicular to an upper surface of the substrate.

The visible light sensor may be between the substrate and the OLED.

The OLED may be between the substrate and the visible light sensor.

The driver may further include an OLED driving transistor and an OLED switching transistor. The OLED driving transistor may be configured to drive the OLED. The visible light sensor, the OLED driving transistor, and the OLED switching transistor may be on a same plane.

The OLED panel may further include a black shield configured to block light emitted by the OLED. The black shield may be between the OLED switching transistor and the OLED, between the OLED driving transistor and the OLED, or a combination thereof.

The visible light emitted by the OLED may include red light, green light, and blue light. The visible light sensor may be configured to selectively detect the blue light.

The OLED may include a first electrode and a second electrode. The first electrode may include a reflecting electrode. The second electrode may include a transparent electrode or a semi-transparent electrode.

According to some example embodiments, an organic light emitting diode (OLED) panel may include a substrate, an OLED on the substrate, the OLED configured to emit visible light, a near infrared ray OLED on the substrate, the near infrared ray OLED configured to emit near infrared rays, and a driver on the OLED, the driver further between the substrate and the near infrared ray OLED, the driver configured to drive both the OLED and the near infrared ray OLED. The driver may include a near infrared ray sensor configured to detect near infrared rays emitted by the near infrared ray OLED. The near infrared ray sensor may overlap the OLED in a direction that is substantially perpendicular to an upper surface of the substrate.

The near infrared ray OLED may be between the substrate and the OLED.

The OLED may be between the substrate and the near infrared ray OLED.

The driver may include an OLED driving transistor configured to drive the OLED. The driver may include a near infrared ray driving transistor configured to drive the near infrared ray OLED. The near infrared ray sensor, the OLED driving transistor, and the near infrared ray driving transistor may be on a same plane.

The OLED panel may further include a black shield configured to block near infrared rays emitted by the near infrared ray OLED. The black shield may be between the OLED driving transistor and the OLED, between the near infrared ray driving transistor and the near infrared ray OLED, or a combination thereof.

The OLED may include a first electrode and a second electrode. The first electrode may include a reflecting electrode. The second electrode may include a transparent electrode or a semi-transparent electrode.

The near infrared ray sensor, the OLED driving transistor, the near infrared ray driving transistor, and the near infrared ray OLED may be on a same plane.

According to some example embodiments, an electronic device may include a memory, a processor, and a display device including an Organic Light Emitting Diode (OLED) panel. The OLED panel may include a substrate, an OLED on the substrate, the OLED configured to emit visible light, and a driver on the OLED, the driver configured to drive the OLED. The driver may include a visible light sensor configured to detect light emitted by the OLED. The visible light sensor may overlap the OLED in a direction that is substantially perpendicular to an upper surface of the substrate.

The processor may be configured to execute a program of instructions stored in the memory to implement biometric recognition of an individual based on processing electrical signals received from the visible light sensor to detect a fingerprint, an iris, or face image.

The driver may further include an OLED driving transistor and an OLED switching transistor. The OLED driving transistor may be configured to drive the OLED. The visible light sensor, the OLED driving transistor, and the OLED switching transistor may be on a same plane.

The OLED panel may further include a black shield configured to block light emitted by the OLED. The black shield may be between the OLED switching transistor and the OLED, between the OLED driving transistor and the OLED, or a combination thereof.

The visible light emitted by the OLED may include red light, green light, and blue light. The visible light sensor may be configured to selectively detect the blue light.

The OLED may include a first electrode and a second electrode. The first electrode may include a reflecting electrode. The second electrode may include a transparent electrode or a semi-transparent electrode.

According to some example embodiments, an electronic device may include a memory, a processor, and a display device including an Organic Light Emitting Diode (OLED) panel. The OLED panel may include a substrate, an OLED on the substrate, the OLED configured to emit visible light, a near infrared ray OLED on the substrate, the near infrared ray OLED configured to emit near infrared rays, and a driver between the substrate and the OLED. The driver may be further between the substrate and the near infrared ray OLED. The driver may be configured to drive both the OLED and the near infrared ray OLED. The driver may include a near infrared ray sensor configured to detect near infrared rays emitted by the near infrared ray OLED. The near infrared ray sensor may overlap the OLED in a direction that is substantially perpendicular to an upper surface of the substrate.

The processor may be configured to execute a program of instructions stored in the memory to implement biometric recognition of an individual based on processing electrical signals received from the near infrared ray sensor to detect a fingerprint, an iris, or face image.

The driver may include an OLED driving transistor configured to drive the OLED. The driver may include a near infrared ray driving transistor configured to drive the near infrared ray OLED. The near infrared ray sensor, the OLED driving transistor, and the near infrared ray driving transistor may be on a same plane.

The electronic device may further include a black shield configured to block near infrared rays emitted by the near infrared ray OLED. The black shield may be between the OLED driving transistor and the OLED, between the near infrared ray driving transistor and the near infrared ray OLED, or a combination thereof.

The OLED may include a first electrode and a second electrode. The first electrode may include a reflecting electrode. The second electrode may include a transparent electrode or a semi-transparent electrode.

The near infrared ray sensor, the OLED driving transistor, the near infrared ray driving transistor, and the near infrared ray OLED may be on a same plane.

BRIEF DESCRIPTION OF THE DRAWINGS

FIG. 2A shows a cross-sectional view of an OLED panel according to some example embodiments of the present inventive concepts.

FIG. 4A shows a cross-sectional view of an OLED panel according to some example embodiments of the present inventive concepts.

FIG. 6C shows a curved line showing a characteristic of an OLED driving transistor according to some example embodiments of the present inventive concepts.

FIG. 10 is a schematic diagram of an electronic device according to some example embodiments of the present inventive concepts.

DETAILED DESCRIPTION

Figure 1A:
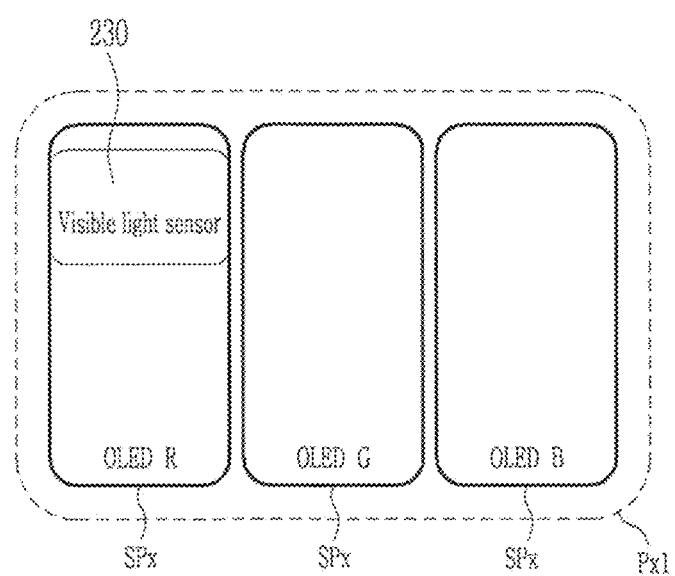
FIG. 1A, FIG. 1B, and FIG. 10 show schematic diagrams of various pixel layouts of an OLED panel according to some example embodiments of the present inventive concepts.

The present inventive concepts will be described more fully hereinafter with reference to the accompanying drawings, in which example embodiments of the inventive concepts are shown. As those skilled in the art would realize, the described example embodiments may be modified in various different ways, all without departing from the spirit or scope of the present inventive concepts.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. In addition, it will be understood that when an element is referred to as being "on" another element, the element may be above or beneath the other element.

An OLED panel according to some example embodiments of the present inventive concepts will now be described with reference to FIGS. 1A-1C and FIGS. 2A-2B.

Figure 1B:
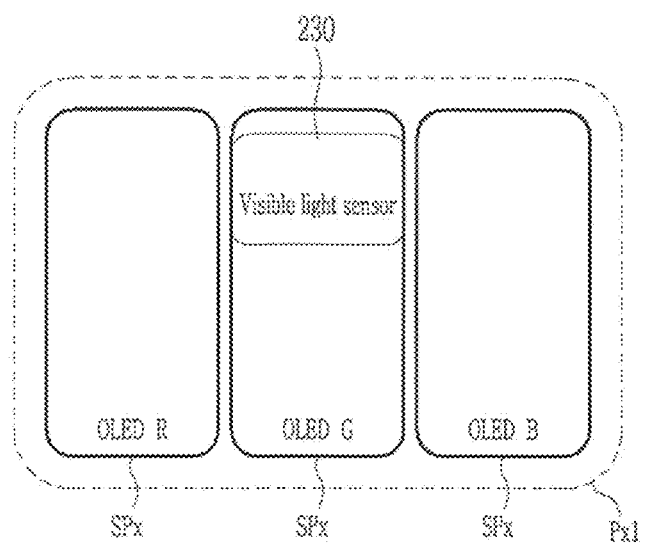
Figure 1C:
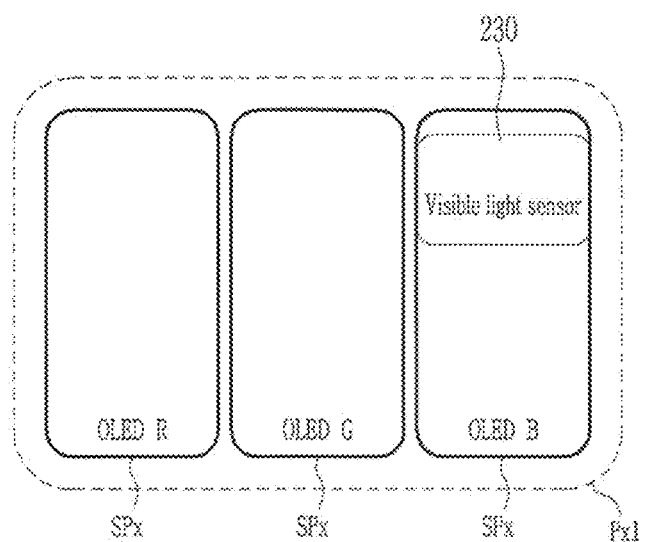

FIG. 1A, FIG. 1B, and FIG. 1C show schematic diagrams of various pixel layouts of an OLED panel according to some example embodiments of the present inventive concepts.

Referring to FIGS. 1A 1C, a pixel Px1 configuring an OLED panel according to some example embodiments of the present inventive concepts includes three sub-pixels (SPx) and visible light sensors 230, and the three sub-pixels (SPx) may be one of a red OLED sub-pixel (OLED R), a green OLED sub-pixel (OLED G), and a blue OLED sub-pixel (OLED B). The visible light sensor 230 is provided on a bottom of a light emitter of one of three sub-pixels (SPx), and it may be disposed to overlap one of the three sub-pixels (SPx).

In detail, the visible light sensor 230 may overlap the red OLED sub-pixel (OLED R) as shown in FIG. 1A, the visible light sensor 230 may overlap the green OLED sub-pixel (OLED G) as shown in FIG. 1B, or the visible light sensor 230 may overlap the blue OLED sub-pixel (OLED B) as shown in FIG. 1C.

Therefore, the sub-pixel (SPx) overlaps the visible light sensor 230, so biometrics may be allowable by using the visible light sensor 230 without influencing the aperture ratio of the OLED light emitter.

For better understanding and ease of description, the visible light sensor 230 is disclosed to be provided on the bottom of the light emitter of one of the three sub-pixels (SPx), but some example embodiments of the present inventive concepts is not limited thereto, the visible light sensor 230 may be provided at the bottom of the light emitter of at least one sub-pixel (SPx), and a plurality of visible light sensors 230 may be provided at the bottom of at least one sub-pixel (SPx).

FIG. 2A shows a cross-sectional view of an OLED panel according to some example embodiments of the present inventive concepts.

Referring to FIG. 2A, the OLED panel 1000 is a stacking-type panel in which the substrate 100, the driver 200, and the OLED light emitter 300 are stacked, and the driver 200 including a visible light sensor 230 is stacked between the substrate 100 and the OLED light emitter 300. That is, the visible light sensor 230 is provided at the bottom of the OLED light emitter 300, so biometrics is allowable by using a visible light sensor 230 without influencing the aperture ratio of the OLED light emitter 300. As shown in at least FIG. 2A, the visible light sensor 230 may overlap the OLED 310 in a direction that is perpendicular or substantially perpendicular (e.g., perpendicular within manufacturing tolerances and/or material tolerances) to an upper surface 100a of the substrate 100.

As referred to herein, an element that is "on" another element may be "above" or "under" the other element. Conversely, an element that is described as being "above" or "under" another element will be understood to be "on" the other element. Additionally, an element that is "on" another element may be "directly on" (e.g., in contact with) the other element or may be "indirectly on" (e.g. isolated from direct contact with via an interposing element(s) and/or a gap space) the other element.

As shown in at least FIG. 2A, the OLED panel 1000 may include a substrate 100, an OLED 310 on the substrate 100, and a driver 200 on the OLED 310, where the driver 200 may be configured to drive the OLED 310. As shown in FIG. 2A, the driver 200 may be between the substrate 100 and the OLED 310, but example embodiments are not limited thereto. While FIG. 2A illustrates the driver 200 as being distal from a front surface 1000a of the OLED panel 1000 in relation to the OLED light emitter 300, such that the visible light sensor 230 is between the OLED 310 and the substrate 100, it will be understood that, in some example embodiments, the driver 200 may be proximate to front surface 1000a in relation to the OLED light emitter 300, such that the OLED light emitter 300, and thus the OLED 310, is between the driver 200 and the substrate 100, and thus the OLED 310 is between the visible light sensor 230 and the substrate 100.

Regarding the OLED panel 1000, the sub-pixels (SPx, refer to FIG. 1) for emitting visible lights (R, G, and B) with different wavelengths are gathered together to configure one pixel (Px1, refer to FIG. 1), and the pixel Px1 is repeated and arranged as a matrix to form the OLED panel 1000.

The OLED light emitter 300 is stacked on the driver 200 to display an image. As shown in FIG. 2A, the OLED light emitter 300 includes an OLED 310 including an organic emission layer 312 and a first electrode 311 and a second electrode 313 formed on the bottom and the top of the organic emission layer 312, respectively, such that the organic emission layer 312 is between the first and second electrodes 311, 313. The OLED 310 may emit visible light having various wavelength spectra.

As shown in FIG. 2A, the OLED 310 may be at least partially on each of a lower insulation layer 360 and an upper insulation layer 340 of the OLED light emitter 300, and may further be at least partially between the lower insulation layer 360 and the upper insulation layer 340.

The organic emission layer 312 may be formed with various organic materials emitting visible light 320 for emitting one of the red R, green G, and blue B colors in a front direction (a direction of an arrow 320 shown in FIG. 2A) of the substrate 100, that is, in an opposite direction to the driver 200. Accordingly, the OLED may emit visible light that includes red light ("red R"), green light ("green G"), and blue light ("blue B").

The first electrode 311 may be formed to be (e.g., may include) a reflecting electrode so that the light emitted by the organic emission layer 312 may be reflected by the second electrode 313 to be displayed to the outside via the front surface 1000a of the OLED panel 1000.

The second electrode 313 may be formed to be (e.g., may include) a semi-transparent electrode or a transparent electrode, for example, MgAg, ITO, or IZO, or Ag or AlTO that is a thin film that is equal to or less than 10 nm thick so that the light emitted by the organic emission layer 312 may be directed through the first electrode 313 to be displayed to the outside via the front surface 1000a of the OLED panel 1000.

One of the first electrode 311 and the second electrode 313 is connected to a driving voltage line (Vdd, refer to FIG. 8) and an output terminal (Out Put) to function as an anode, and the other functions as a cathode. One of the first electrode 311 and the second electrode 313 receives a driving voltage from the OLED driving transistor 210 of the driver 200 and emits visible light.

A cover glass (not shown) attached by an adhesive (not shown) is provided on the top of the OLED light emitter 300 to protect a lower structure and form a display surface and a biometric surface.

The driver 200 is formed on the substrate 100, and it includes an OLED driving transistor 210, an OLED switching transistor 220, a visible light sensor 230, black shields 215 and 225, and an interlayer insulating layer 240. The OLED driving transistor 210 may drive the OLED 310. The OLED driving transistor 210, the OLED switching transistor 220, and the visible light sensor 230 may be formed on a same plane, as shown in FIG. 2A for example. When they are formed on the same plane, a process for forming an OLED driving transistor 210, an OLED switching transistor 220, and a visible light sensor 230 may be simultaneously performed, so there is no need to manufacture an additional processing mask and the number of processing stages may be reduced, compared to the case of forming the same on a different plane. Further, the panel may be manufactured to be thinner than the case of forming the same on the different plane, which me be further preferable in realization of the flexible panel.

The OLED driving transistor 210 includes a gate electrode 211, a gate insulating layer 212, an electrode layer 213, and an electrode insulating layer 214. The electrode layer 213 may form a first end or a second end of the OLED driving transistor 210 and the first end or the second end may be connected to the second electrode 311 through a contact hole 217.

For better understanding and ease of description, the semiconductor layer (216, refer to FIG. 7A) of the OLED driving transistor 210 is omitted, and a detailed structure of the OLED driving transistor 210 including a semiconductor layer 216 will be described in a later portion of the present specification.

A black shield 215 is formed at the top of the OLED driving transistor 210 to shield the visible light 330 emitted by the OLED light emitter 300 and reflected or scattered. Restated, the black shield 215 may block the visible light emitted by the OLED 310 from reaching the OLED driving transistor 210. As shown in FIG. 2A, the black shield 215 may be between the OLED driving transistor 210 and the OLED 310.

The OLED switching transistor 220 includes a gate electrode 221, a gate insulating layer 222, an electrode layer 223, and an electrode insulating layer 224.

A black shield 225 is formed at the top of the OLED switching transistor 220 to shield the visible light 330 emitted by the OLED light emitter 300 and reflected or scattered. Restated, the black shield 225 may block the visible light emitted by the OLED 310 from reaching the OLED switching transistor 220. As shown in FIG. 2A, the black shield 225 may be between the OLED switching transistor 220 and the OLED 310. In some example embodiments, the black shield 215 and the black shield 225 may be a single black shield that forms at least a part of a unitary piece of material that extends between the OLED 310 and the transistors 210, 220, such that the single black shield is between the OLED switching transistor 220 and the OLED 310 and is further between the OLED driving transistor 210 and the OLED 310. Accordingly, a black shield in the OLED panel 1000 may be between the OLED switching transistor 220 and the OLED 310, between the OLED driving transistor 210 and the OLED 310, or a combination thereof.

The visible light sensor 230 includes a gate electrode 231, a gate insulating layer 232, an electrode layer 233, and an electrode insulating layer 234, and it may selectively absorb and/or selectively detect the visible light 330 (e.g., one of the red light, green light, and blue light) emitted by the organic emission layer 312 and reflected or scattered. Restated, the visible light sensor 230 may detect visible light emitted by the OLED 310. For example, the visible light sensor 230 may selectively detect the blue light, of the visible light 320 emitted by the OLED 310, such that the visible light sensor 230 does not detect the red light or the green light of the visible light 320. The semiconductor layer (235, refer to FIG. 6A) of the visible light sensor 230 is omitted, and a detailed configuration of the visible light sensor 230 including a semiconductor layer 235 will be described in a later portion of the present specification.

In some example embodiments, the cross-section view shown in FIG. 2A is a cross-sectional view of at least one sub-pixel SPx of a plurality of sub-pixels SPx of a pixel PX1, including, for example, the "red" sub-pixel of pixel Px1 as shown in FIG. 1A. Accordingly, the OLED 310 of each separate sub-pixel SPX may emit a separate light of red light, green line, or blue light, such that the plurality of sub-pixels SPx of the pixel Px1 collectively emit the red light, the green light, and the blue light. In some example embodiments, including the example embodiments shown in FIGS. 1A-1C, the driver 200 of at least one particular sub-pixel SPx includes the visible light sensor 230 that is configured to detect the visible light emitted by at least one OLED 310 of the plurality of sub-pixels. For example, a visible light sensor 230 of at least one particular sub-pixel SPx may be configured to selectively detect blue light, which may be emitted by the OLED 310 of the same particular sub-pixel SPx or a different sub-pixel SPx of the pixel Px1.

Figure 8:
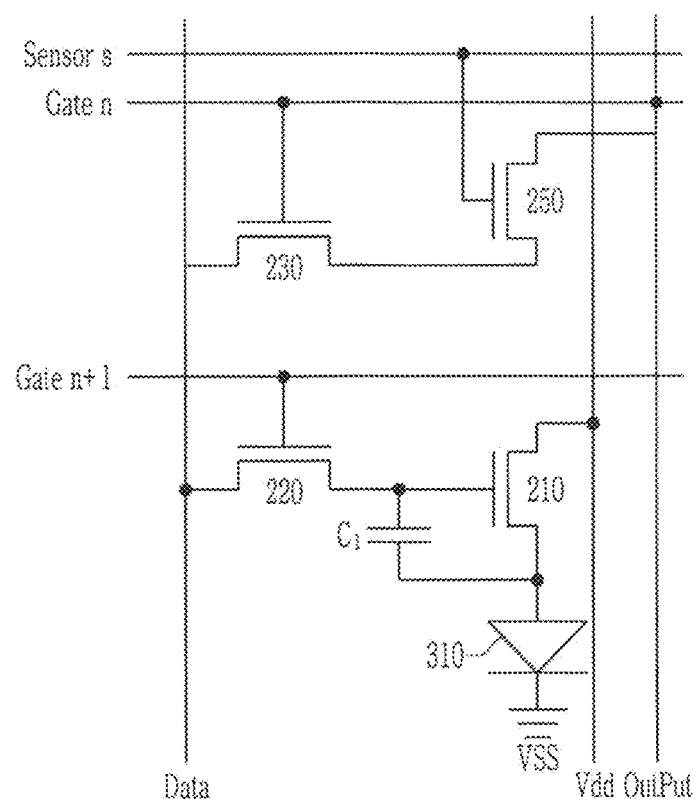
FIG. 8 shows a driving circuit of a driver according to some example embodiments of the present inventive concepts.

For better understanding and ease of description, the driver 200 has been described to include the OLED driving transistor 210, the OLED switching transistor 220, and the visible light sensor 230, and the driver 200 may further include a visible light sensor switch transistor 250 and a capacitor C1 (refer to FIG. 8).

The substrate 100 may be formed with various materials such as glass or plastic. In the case of plastic, it may be formed of a transparent and flexible material.

A fingerprint recognizing process using an OLED panel according to some example embodiments of the present inventive concepts will now be described with reference to FIG. 2B.

Figure 2B:
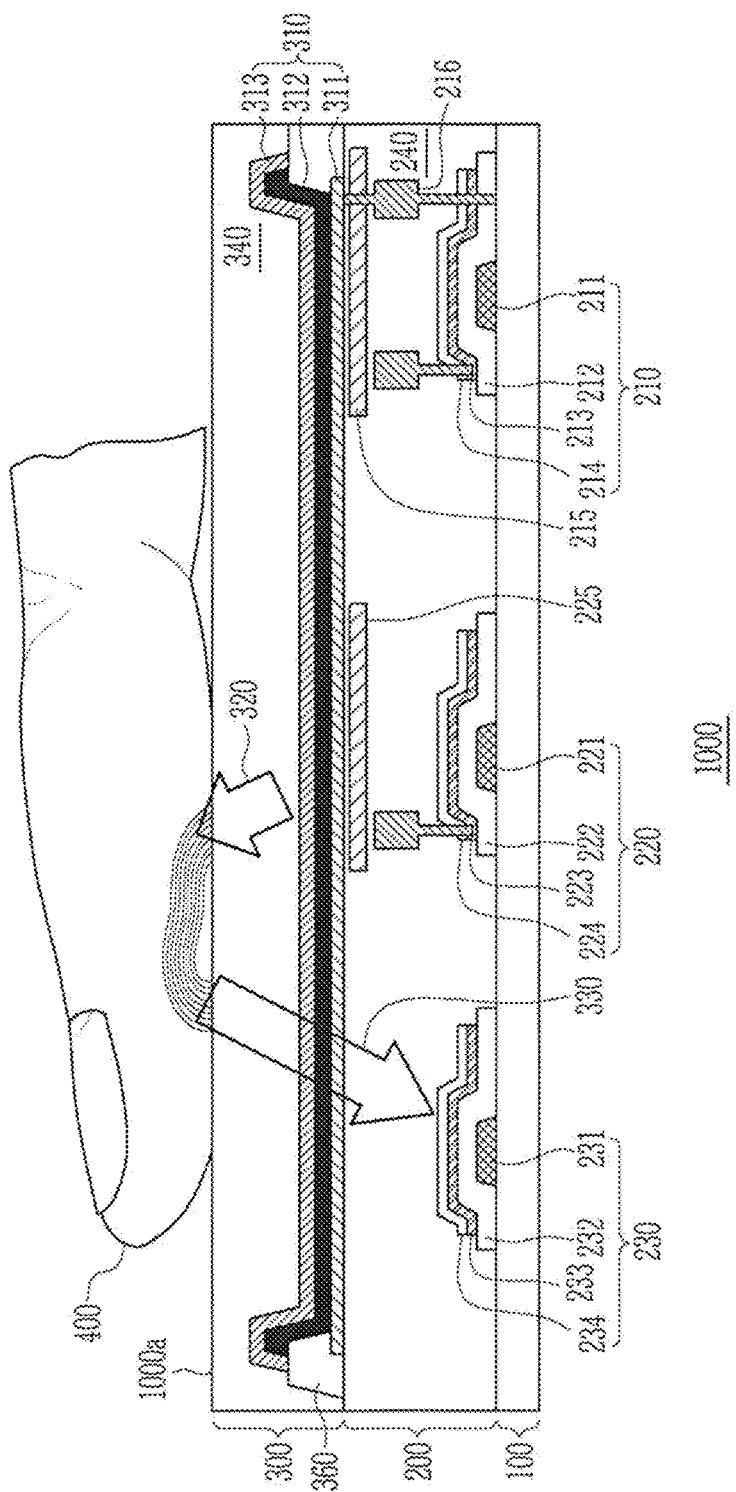
FIG. 2B shows a cross-sectional view for describing a fingerprint recognizing process using an OLED panel according to some example embodiments of the present inventive concepts.

FIG. 2B shows a cross-sectional view for describing a fingerprint recognizing process using an OLED panel according to some example embodiments of the present inventive concepts.

Referring to FIG. 2B, when a biometric object, for example, a finger 400 is provided on the front surface 1000a of the OLED panel 1000, a driving signal for turning on the OLED driving transistor 210 and the OLED switching transistor 220 of the driver 200, and the visible light 320 is discharged from the OLED light emitter 300 by the OLED driving transistor 210 and is irradiated to the fingerprint of the finger 400. The visible light 320 may be reflected or scattered on the surface of the finger 400. The reflected or scattered visible light 330 may be received by the visible light sensor 230 and may then be detected. In this instance, the reflected or scattered visible light 330 is blocked by the black shields 215 and 225 and does not reach the OLED driving transistor 210 and the OLED switching transistor 220.

Charges received by the visible light sensor 230 are read, pass through an image processor to acquire a fingerprint image of the finger 400, and a fingerprint recognition may be performed based upon the acquisition of image.

FIG. 2B has exemplified the fingerprint of the finger 500 as the object of biometrics, and various biometrics such as finger palm print, iris, retina, or face are applicable.

An OLED panel according to some example embodiments of the present inventive concepts will now be described with reference to FIG. 3 to FIG. 5.

FIG. 3A, FIG. 3B, FIG. 3C, FIG. 3D, and FIG. 3E show schematic diagrams of various pixel layouts of an OLED panel according to some example embodiments of the present inventive concepts.

Referring to FIGS. 3A to 3E, the pixel Px2 configuring the OLED panel according to some example embodiments of the present inventive concepts includes three sub-pixels (SPx), near infrared ray sensors 630, and near infrared ray OLEDs 710. The sub-pixels (SPx) may respectively be one of the red OLED sub-pixel (OLED R), green OLED sub-pixel (OLED G) and blue OLED sub-pixel (OLED B). The near infrared ray sensor 630 and the near infrared ray OLED 710 may be provided at the bottom of the light emitter of at least one of the three sub-pixels (SPx) and may be disposed to overlap at least one of the three sub-pixels (SPx).

Therefore, the sub-pixel (SPx) overlaps the near infrared ray sensor 630 and the near infrared ray OLED 710, so biometrics may be allowable by using the near infrared ray sensor 630 and the near infrared ray OLED 710 without influencing the aperture ratio of the OLED light emitter.

Figure 3A:
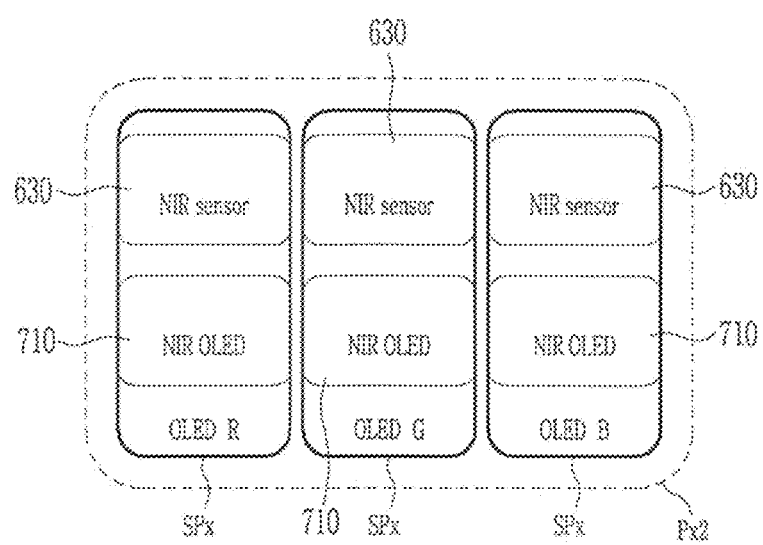
FIG. 3A, FIG. 3B, FIG. 3C, FIG. 3D, and FIG. 3E show schematic diagrams of various pixel layouts of an OLED panel according to some example embodiments of the present inventive concepts.

In detail, as shown in FIG. 3A, a pair of the near infrared ray sensor 630 and the near infrared ray OLED 710 may respectively overlap the red OLED sub-pixel (OLED R), the green OLED sub-pixel (OLED G), and the blue OLED sub-pixel (OLED B).

Figure 3B:
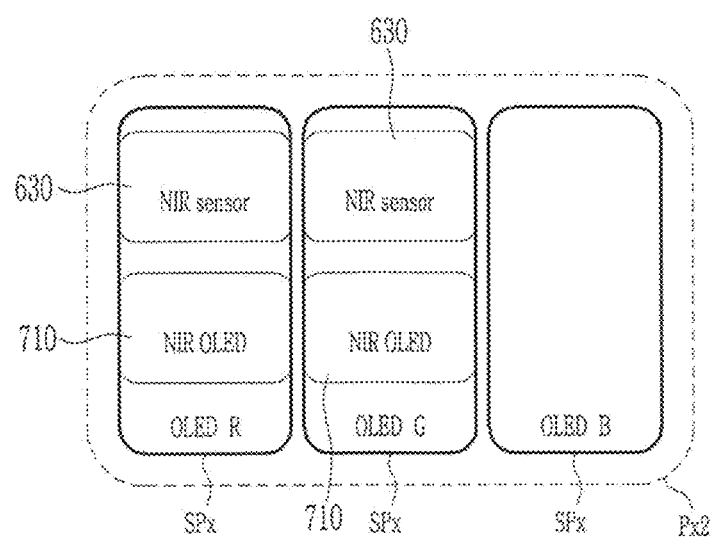

As shown in FIG. 3B, a pair of the near infrared ray sensor 630 and the near infrared ray OLED 710 may respectively overlap the red OLED sub-pixel (OLED R) and the green OLED sub-pixel (OLED G).

Figure 3C:
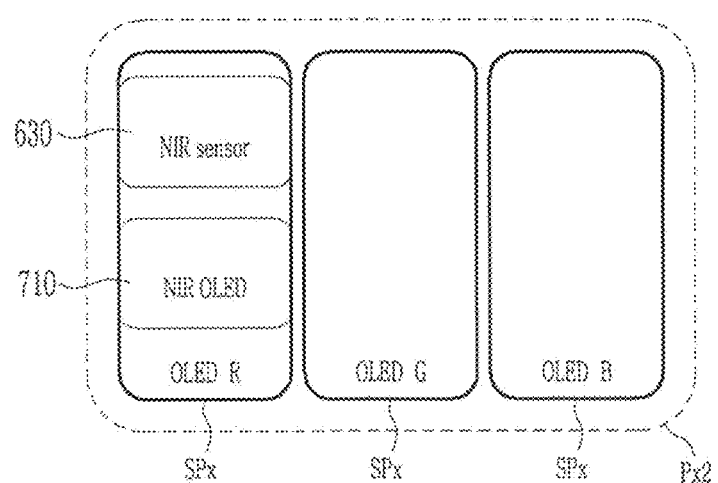
Figure 3D:
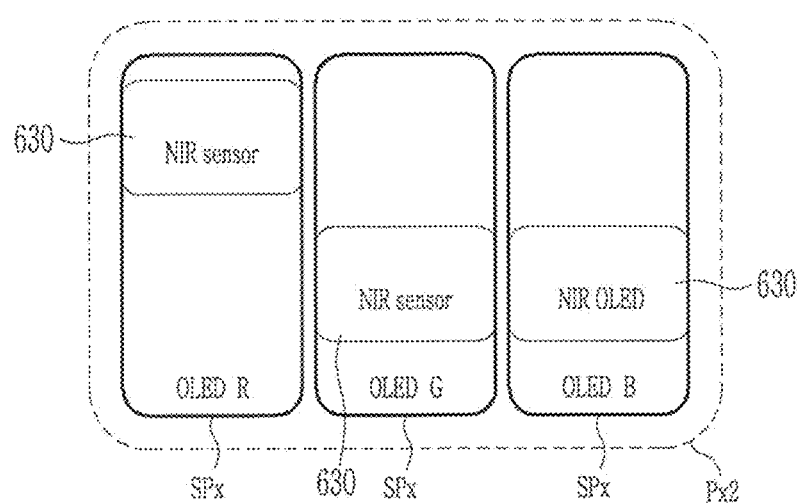

As shown in FIG. 3C, a pair of the near infrared ray sensor 630 and the near infrared ray OLED 710 may overlap the red OLED sub-pixel (OLED R). As shown in FIG. 3D, two near infrared ray sensors 630 may overlap the red OLED sub-pixel (OLED R) and the blue OLED sub-pixel (OLED B), and one near infrared ray OLED 710 may overlap the green OLED sub-pixel (OLED G). In this instance, it is shown in FIG. 3D that two near infrared ray sensors 630 and one near infrared ray OLED 710 are disposed in different columns, and the example embodiments are not limited thereto, and the two near infrared ray sensors 630 and the one near infrared ray OLED 710 may be disposed in the same column or disposed in the different columns.

Figure 3E:
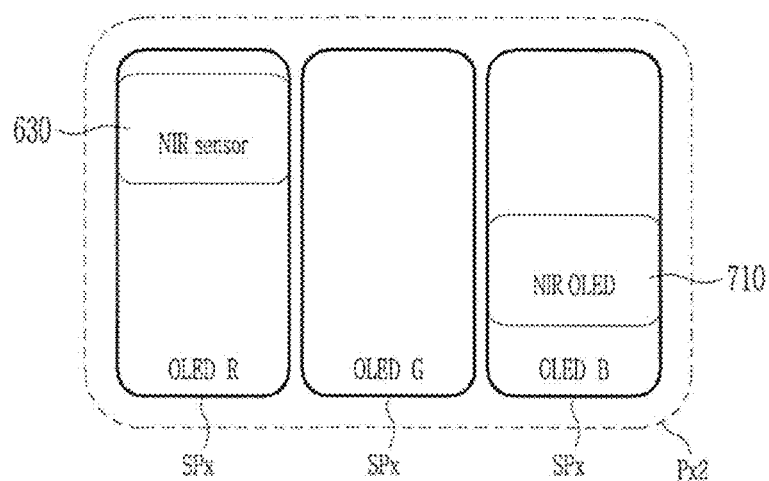

As shown in FIG. 3E, one near infrared ray sensor 630 may overlap the red OLED sub-pixel (OLED R), and one near infrared ray OLED 710 may overlap the blue OLED sub-pixel (OLED B). In this instance, it is shown in FIG. 3E that one near infrared ray sensor 630 overlaps the red OLED sub-pixel (OLED R) and one near infrared ray OLED 710 overlaps the blue OLED sub-pixel (OLED B), the example embodiments are not limited thereto, one near infrared ray sensor 630 or one near infrared ray OLED 710 may overlap one of the three sub-pixels (SPx), and one near infrared ray sensor 630 or one near infrared ray OLED 710 may be differently combined if needed.

Hence, the sub-pixel (SPx) overlaps the visible light sensor 230, so biometrics is allowable by using the visible light sensor 230 without influencing the aperture ratio of the OLED light emitter.

An OLED panel according to some example embodiments of the present inventive concepts will now be described with reference to FIG. 4 and FIG. 5.

FIG. 4A shows a cross-sectional view of an OLED panel according to some example embodiments of the present inventive concepts.

Referring to FIG. 4A, the OLED panel 2000 according to some example embodiments of the present inventive concepts represents a stacking-type panel in which a substrate 500, a driver 600, a near infrared ray light emitter 700, and an OLED light emitter 800 are stacked, and a driver 600 including a near infrared ray sensor 630 and a near infrared ray light emitter 700 stacked on the driver 600 are disposed between the substrate 500 and the OLED light emitter 800. The near infrared ray light emitter 700 includes a near infrared ray OLED 710 that may emit near infrared rays (e.g., near infrared light). The near infrared ray sensor 630 may detect near infrared rays emitted by the near infrared ray OLED 710. The near infrared ray light emitter 700 and the near infrared ray sensor 630 are provided at the bottom of the OLED light emitter 800 to thus allow biometrics by using an infrared light sensor 630 without influencing the aperture ratio of the OLED light emitter 800.

As shown in at least FIG. 4A, the near infrared ray sensor 630 may overlap the OLED 310 in a direction that is perpendicular or substantially perpendicular (e.g., perpendicular within manufacturing tolerances and/or material tolerances) to an upper surface 500a of the substrate 500. Additionally, as shown in at least FIG. 4A, the near infrared ray sensor 630 may be offset from the near infrared ray OLED 710 in a direction that is parallel or substantially parallel (e.g., parallel within manufacturing tolerances and/or material tolerances) to the upper surface 500a of the substrate 500, such that the near infrared ray sensor 630 does not overlap the near infrared ray OLED 710 in the direction that is perpendicular or substantially perpendicular to the upper surface 500a of the substrate 500.

As shown in at least FIG. 4A, the OLED panel 2000 may include a substrate 500, an OLED 310 on the substrate 500, a driver 600 on the OLED 310, and a near infrared ray OLED 710 on the substrate, where the driver 600 may be configured to drive the OLED 310. As shown in FIG. 4A, the driver 200 may be between the substrate 500 and the OLED 310 and may further be between the substrate 500 and the near infrared ray OLED 710, such that the near infrared ray OLED 710 is between the OLED 710 and the driver 600, but example embodiments are not limited thereto. While FIG. 4A illustrates the near infrared ray OLED 710 as being distal from a front surface 2000a of the OLED panel 2000 in relation to the OLED light emitter 800, such that the near infrared ray OLED 710 is between the OLED 310 and the substrate 500, it will be understood that, in some example embodiments, the near infrared ray OLED 710 may be proximate to front surface 2000a in relation to the OLED light emitter 800, such that the OLED light emitter 800, and thus the OLED 310, is between the near infrared ray OLED 710 and the substrate 500.

Regarding the OLED panel 2000, sub-pixels (SPx, refer to FIG. 3) for emitting the visible lights (R, G, and B) with different wavelengths are gathered to configure one pixel (Px2, refer to FIG. 3), and the pixel Px2 is repeated in rows and columns to complete the OLED panel 2000.

The OLED light emitter 800 is stacked on the near infrared ray light emitter 700 to display an image. As shown in FIG. 4A, the OLED light emitter 800 includes a visible light OLED (OLED, 310) including an organic emission layer 812, and a first electrode 811 and a second electrode 813 formed at the bottom and the top of the organic emission layer 812, respectively, such that the organic emission layer 812 is between the first and second electrodes 811, 813. The OLED 310 may emit visible light having various wavelength spectra. As shown in FIG. 4A, the OLED 310 may be at least partially on each of a lower insulation layer 860 and an upper insulation layer 840 of the OLED light emitter 800, and may further be at least partially between the lower insulation layer 860 and the upper insulation layer 840. The organic emission layer 812 may be formed with various organic materials for emitting visible light (820) that includes one of the red R, green G, and blue B colors in a front direction (an arrow direction 820 of FIG. 4A through front surface 2200a) of the substrate 500, that is, an opposite direction to the driver 600. Accordingly, the OLED may emit visible light that includes red light ("red R"), green light ("green G"), and blue light ("blue B"). One of the first electrode 811 and the second electrode 813 is connected to the driving voltage line (Vdd, refer to FIG. 9) and the output terminal (Out Put) to function as an anode, and the other functions as a cathode.

The OLED panel 1000 according to some example embodiments of the present inventive concepts recognizes the fingerprint with the visible light of the OLED light emitter 300, and the OLED light emitter 800 of the OLED panel according to a first aspect of some example embodiments of the present inventive concepts emits visible light when displaying images, and it is not used in the recognition of fingerprints.

The first electrode 811 may be formed to be (e.g., may include) a reflecting electrode so that the light emitted by the organic emission layer 812 may be well displayed to the outside.

The second electrode 813 may be formed to be (e.g., may include) a semi-transparent or a transparent electrode, for example, MgAg, ITO, or IZO, or Ag or AlTO that is a thin film that is equal to or less than 10 nm thick so that the light emitted by the organic emission layer 812 may be well displayed.

A cover glass (not shown) attached by an adhesive (not shown) is provided on the top of the OLED light emitter 800 to protect a lower structure and form a display surface and a biometric surface.

The near infrared ray light emitter 700 is stacked between the OLED light emitter 800 and the driver 600 and includes a near infrared ray light emitting diode (OLED, 710) and an interlayer insulating layer 740. The near infrared ray (NIR) light emitting diode 710 includes a near infrared ray emission layer 712 for emitting light with the wavelength of the near infrared ray, and a first electrode 713 and a second electrode 711 formed at the top and the bottom of the near infrared ray emission layer 712.

The near infrared ray emission layer 712 is an organic emission layer, it may be formed with one of materials exemplified in Chemical Formula 1 that is appropriate for emitting near infrared rays with the wavelength of 800 to 1500 nm, or a mixture thereof, which is an example, and any materials that are appropriate for emitting light with the wavelength of the near infrared ray are usable.

[Chemical Formula 1]

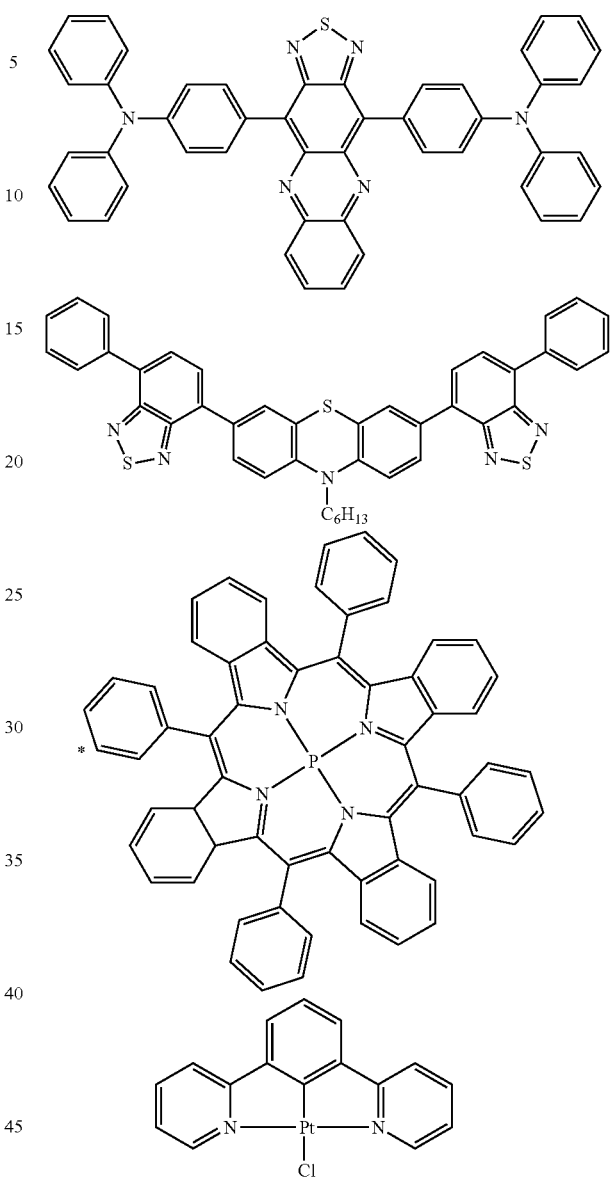

One of the first electrode 713 and the second electrode 711 is connected to the driving voltage line (Vdd, refer to FIG. 9) and the output terminal (Out Put) to function as an anode, and the other functions as a cathode. One of the first electrode 713 and the second electrode 711 receives a driving voltage from the near infrared ray driving transistor 620 of the driver 600 to emit near infrared rays.

The driver 600 is formed on the substrate 500, and it includes an OLED driving transistor 610, a near infrared ray driving transistor 620, a near infrared ray sensor 630, black shields 615 and 625, and an interlayer insulating layer 640. The OLED driving transistor 610 may drive the OLED 310. The near infrared ray driving transistor 620 may drive the near infrared ray OLED 710. As shown in FIG. 4A, the OLED driving transistor 610, the near infrared ray driving transistor 620, and the near infrared ray sensor 630 may be formed on the same plane. When they are formed on the same plane, the process for forming an OLED driving transistor 610, a near infrared ray driving transistor 620, and a near infrared ray sensor 630 forming process may be simultaneously performed, so there is no need to manufacture an additional process mask, compared to the case in which they are formed on a different plane, and the number of processing stages may be reduced. Further, the thickness of the panel may be reduced compared to the case in which they are formed on a different plane, which may be desirable to realize a flexible panel.

The OLED driving transistor 610 includes a gate electrode 611, a gate insulating layer 612, an electrode layer 613, and an electrode insulating layer 614. The electrode layer 613 may form a first end or a second end of the OLED driving transistor 610 and may be connected to the second electrode 813 through the contact hole 616.

The near infrared ray driving transistor 620 includes a gate electrode 621, a gate insulating layer 622, an electrode layer 623, and an electrode insulating layer 624. The electrode layer 623 may form a first end or a second end of the near infrared ray driving transistor 620 and may be connected to the second electrode 711 through the contact hole 626.

The near infrared ray sensor 630 includes a gate electrode 631, a gate insulating layer 632, an electrode layer 633, and an electrode insulating layer 634, and it may absorb and detect the near infrared rays 730 emitted by the near infrared ray emission layer 712 and reflected or scattered.

The near infrared ray sensor 630 may be an NIR organic photodiode, and an organic emission layer (not shown) included in the near infrared ray sensor 630 may be formed with a material that is appropriate for absorbing the NIR wavelength. That is, it may be formed with a material that is appropriate for absorbing the light with the wavelength of 800-1500 nm. For example, it may be formed with one of the materials exemplified in Chemical Formula 2 or a mixture thereof, which is an example, and any materials that are appropriate for absorption of the light of desired NIR wavelengths are usable.

[Chemical Formula 2]

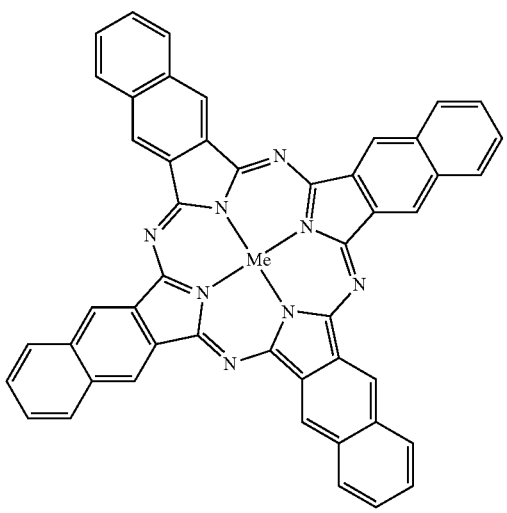

[Naphthalocyanine]

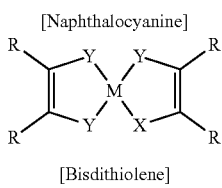

[Bisdithiolene]

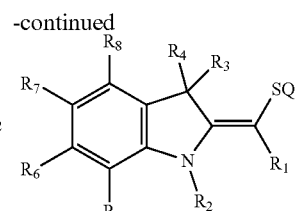

[Squaranine]

An electrode of the near infrared ray sensor 630 is formed of a transparent electrode so as to absorb the incident near infrared rays to the maximum. Preferably, it is formed of a transparent electrode with transmittance that is equal to or greater than 80%. For example, it may be formed of ITO, IZO, AlTO, carbon nanotube (CNT), graphene (Graphen), or nanosilver (Nano Ag).

A black shield 615 is formed at the top of the OLED driving transistor 610, and a black shield 625 is formed at the top of the near infrared ray driving transistor 620 to thus shield the near infrared rays 730 emitted by the near infrared ray emission layer 712 and reflected or scattered. The black shield 615 may block the visible light emitted by the OLED 310 from reaching the OLED driving transistor 610. As shown in FIG. 4A, the black shield 615 may be between the OLED driving transistor 610 and the OLED 310. The black shield 625 may block the visible light emitted by the OLED 310 from reaching the near infrared ray driving transistor 620. As shown in FIG. 4A, the black shield 625 may be between the near infrared ray driving transistor 620 and the OLED 310. In some example embodiments, the black shield 615 and the black shield 625 may be a single black shield that forms at least a part of a unitary piece of material that extends between the OLED 310 and the transistors 610, 620, such that the single black shield is between the near infrared ray driving transistor 620 and the OLED 310 and is further between the OLED driving transistor 610 and the OLED 310. Accordingly, a black shield in the OLED panel 2000 may be between the near infrared ray driving transistor 620 and the OLED 310, between the OLED driving transistor 610 and the OLED 310, or a combination thereof.

Figure 9:
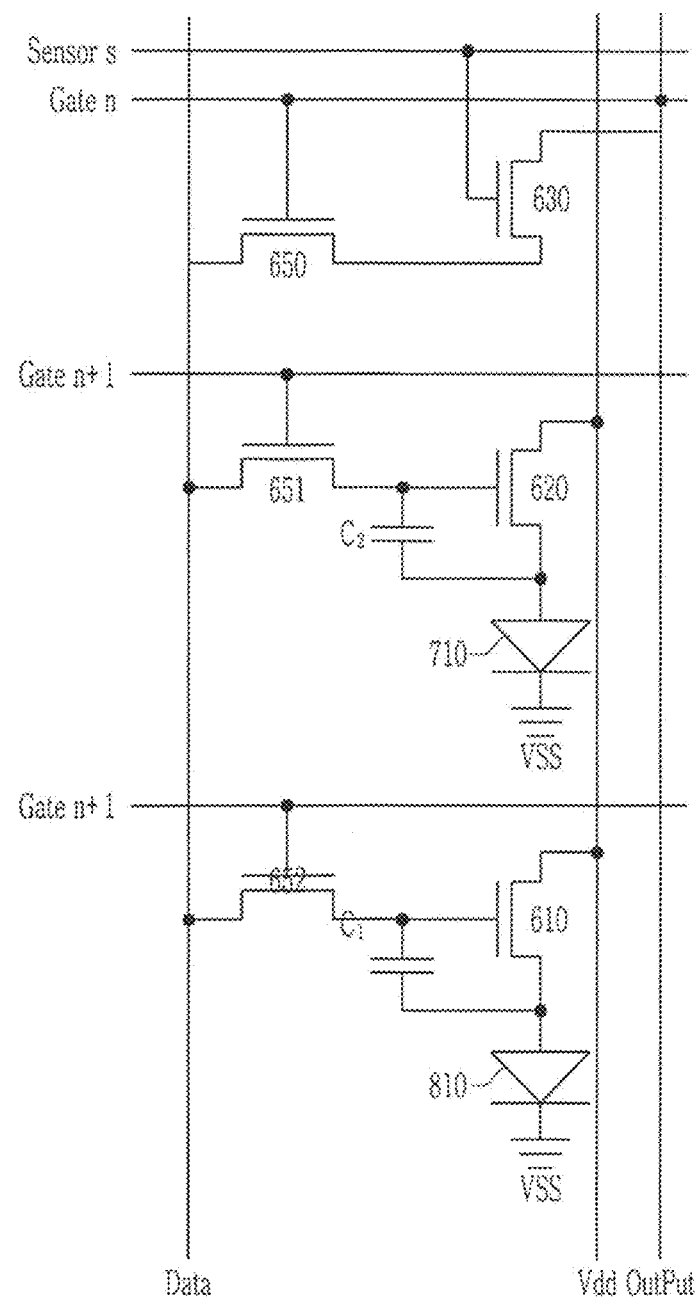
FIG. 9 shows a driving circuit according to some example embodiments of the present inventive concepts.

For better understanding and ease of description, the driver 600 has been described to include an OLED driving transistor 610, a near infrared ray driving transistor 620, a near infrared ray sensor 630, black shields 615 and 625, and an interlayer insulating layer 640, and the driver 600 may further include an OLED switching transistor 652, a near infrared ray switching transistor 651, a near infrared ray sensor switching transistor 650, a capacitor C1, and a capacitor C2 (refer to FIG. 9).

The substrate 500 may be formed of various materials such as glass or plastic. In the case of plastic, it may be formed of a transparent and flexible material.

Figure 4B:
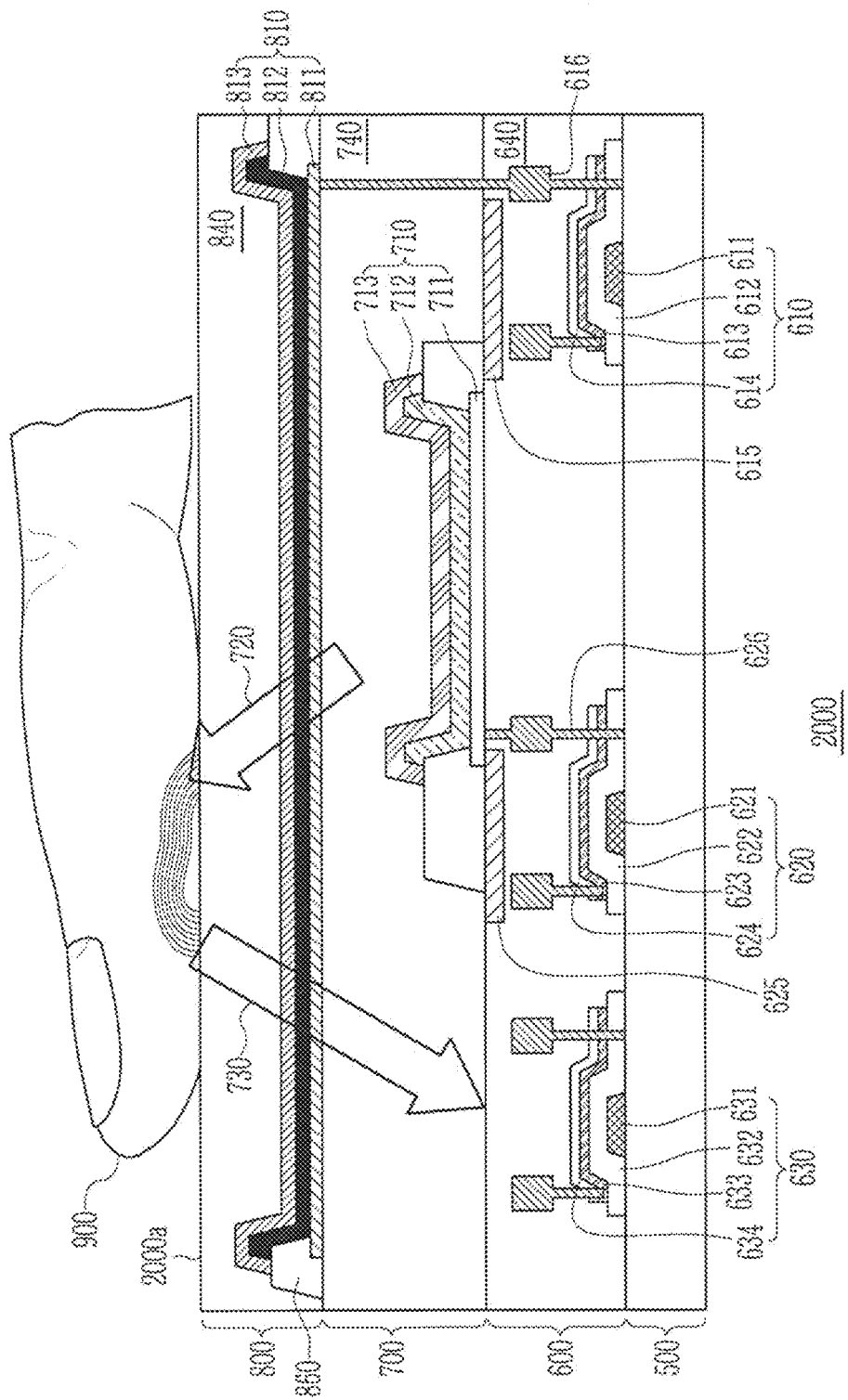
FIG. 4B shows a cross-sectional view of a fingerprint recognizing process using an OLED panel according to some example embodiments of the present inventive concepts.

A fingerprint recognizing process using an OLED panel according to a first aspect of some example embodiments of the present inventive concepts will now be described with reference to FIG. 4B. FIG. 4B shows a cross-sectional view of a fingerprint recognizing process using an OLED panel according to a first aspect of some example embodiments of the present inventive concepts.

When a biometric object, for example, a finger 900 is provided on the front surface 2000a of the OLED panel 2000, a driving signal for turning on the near infrared ray driving transistor 620 and the near infrared ray sensor 630 of the driver 600 is applied.

The near infrared rays 720 are discharged from the organic emission layer 712 of the near infrared ray OLED 710 of the near infrared ray light emitter 700 by the near infrared ray driving transistor 620, and are irradiated to a fingerprint of the finger 900. The near infrared rays 720 may be reflected or scattered on the surface of the finger 900. The reflected or scattered near infrared rays 730 may be received in the near infrared ray sensor 630 and may then be detected. In this instance, the reflected or scattered near infrared rays 730 are blocked by the black shields 615 and 625 and do not reach the near infrared ray driving transistor 620 and the near infrared ray sensor 630.

The charges received in the near infrared ray sensor 630 are output to pass through an image processor, acquire a fingerprint image of the finger 900, and perform a fingerprint recognition process.

In some example embodiments, the cross-section view shown in FIG. 4A is a cross-sectional view of at least one sub-pixel SPx of a plurality of sub-pixels SPx of a pixel Px2, including, for example, the "red" sub-pixel of pixel Px2 as shown in FIG. 3C. Accordingly, the OLED 310 of each separate sub-pixel SPx may emit a separate light of red light, green line, or blue light, such that the plurality of sub-pixels SPx of the pixel Px2 collectively emit the red light, the green light, and the blue light.

In some example embodiments, including the example embodiments shown in FIGS. 3A-3E, at least one sub-pixel SPx of the plurality of sub-pixels SPx includes a near infrared ray OLED 710 and at least one sub-pixel SPx of the plurality of sub-pixels SPx includes a driver 600 that includes a near infrared ray sensor 630 configured to detect the near infrared rays emitted by the near infrared ray OLED 710. As shown in at least FIG. 3C, at least one sub-pixel SPx may include both a near infrared ray OLED 710 and a near infrared ray sensor 630, such that the near infrared ray OLED 710 and the near infrared ray sensor 630 are included in a common at least one sub-pixel SPx of the pixel Px2. As shown in at least FIGS. 3D-3E, the near infrared ray OLED and the near infrared ray sensor may be included in different sub-pixels SPx, such that the at least one sub-pixels SPx that includes the near infrared ray OLED 710 is different from the at least one sub-pixel SPx that includes the near infrared ray sensor 630.

For example, a visible light sensor 230 of at least one particular sub-pixel SPx may be configured to selectively detect blue light, which may be emitted by the OLED 310 of the same particular sub-pixel SPx or a different sub-pixel SPx of the pixel Px1.

FIG. 4B exemplifies the fingerprint of the finger 900 as a biometric object, and the finger palm print, iris, retina, and face are applicable to the biometrics.

Figure 5:
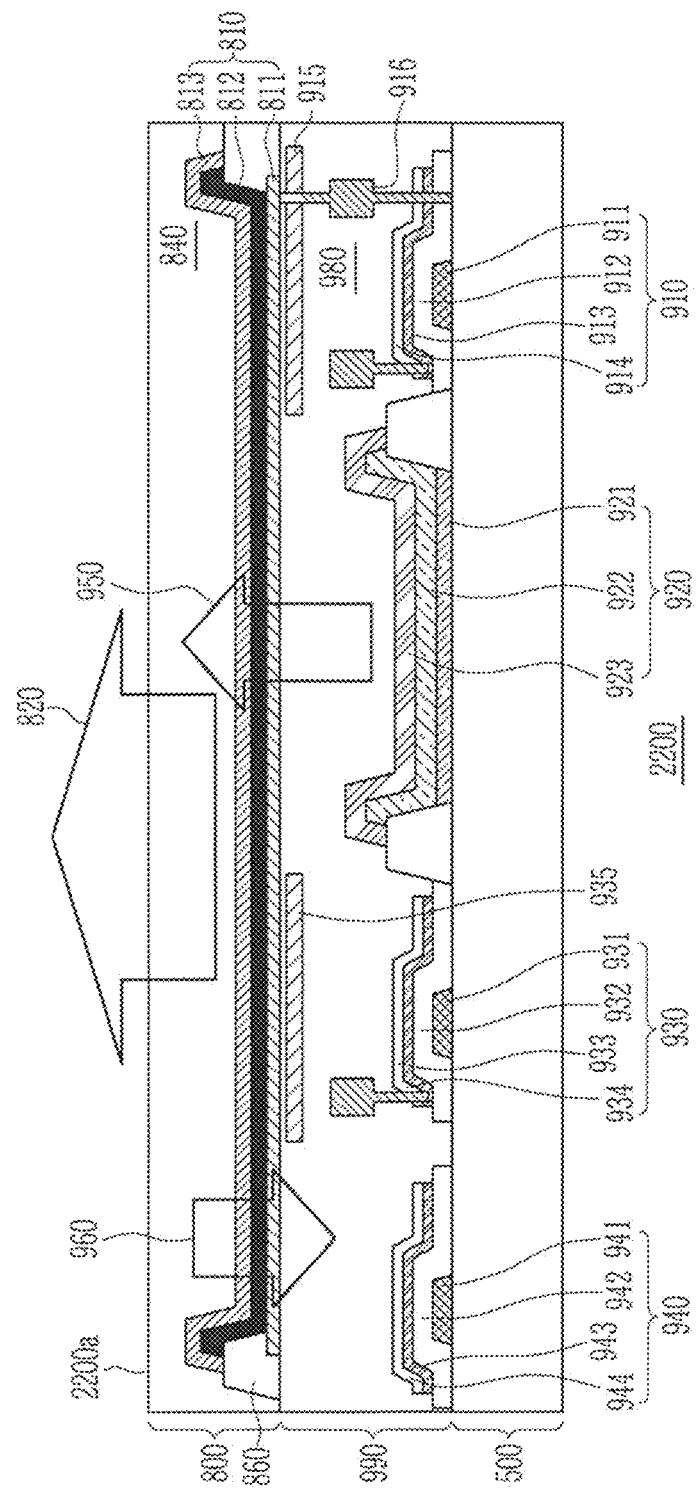
FIG. 5 shows a cross-sectional view of an OLED panel according to some example embodiments of the present inventive concepts.

FIG. 5 shows a cross-sectional view of an OLED panel according to a second aspect of some example embodiments of the present inventive concepts.

Referring to FIG. 5, the OLED panel 2200 according to some example embodiments of the present inventive concepts represents a stacking-type panel in which a substrate 500, a light emitting and driver 990, and an OLED light emitter 800 are stacked, and a light emitting and driver 990 including an OLED driving transistor 910, a near infrared ray light emitter 920, a near infrared ray driving transistor 930, and a near infrared ray sensor 940 is disposed between the substrate 500 and the OLED light emitter 800. The near infrared ray light emitter 920 includes a near infrared ray OLED that may emit near infrared rays (e.g., near infrared light). The near infrared ray sensor 940 may detect near infrared rays emitted by the near infrared ray OLED. The near infrared ray light emitter 920 and the near infrared ray sensor 940 are provided at the bottom of the OLED light emitter 800 to allow biometrics by using the visible light sensor 230 without influencing the aperture ratio of the OLED light emitter 800.

The OLED panel 2200 according to some example embodiments are different from the OLED panel 2000 as shown in FIGS. 4A-4B in the light emission and the configuration of the driver 990, and the configurations of the substrate 500 and the OLED light emitter 800 are the same. Therefore, the descriptions on the substrate 500 and the OLED light emitter 800 will refer to the description on the OLED panel 2000 of FIGS. 4A-4B.

Regarding the OLED panel 2200, the sub-pixels (SPx, refer to FIG. 3) for emitting visible lights (R, G, B) with different wavelengths are gathered to form a pixel (Px2, refer to FIG. 3), and the pixel Px2 is repeated in rows and columns to complete an OLED panel 2000.

The light emitting and driver 990 includes an OLED driving transistor 910, a near infrared ray light emitter 920, a near infrared ray driving transistor 930, a near infrared ray sensor 940, black shields 915 and 935, and an interlayer insulating layer 980. As shown in FIG. 5, the near infrared ray sensor 940, the OLED driving transistor 910, the near infrared ray driving transistor 930, and the near infrared ray OLED that is the near infrared ray light emitter 920 may be on a same plane.

The OLED driving transistor 910, the near infrared ray light emitter 920, the near infrared ray driving transistor 930, and the near infrared ray sensor 940 may be formed on the same plane. When they are formed on the same plane, the process for forming an OLED driving transistor 910, a near infrared ray light emitter 920, a near infrared ray driving transistor 930, and a near infrared ray sensor 940 may be simultaneously performed, so there is no need to manufacture an additional process mask, compared to the case in which they are formed on a different plane, and the number of processing stages may be reduced. Further, the thickness of the panel may be reduced compared to the case in which they are formed on a different plane, which may be desirable to realize a flexible panel.

The OLED driving transistor 910 includes a gate electrode 911, a gate insulating layer 912, an electrode layer 913, and an electrode insulating layer 914. The electrode layer 913 forms a first end or a second end of the OLED driving transistor 910 and it may be connected to the second electrode 813 of the OLED light emitter 800 through the contact hole 916.

The near infrared ray light emitter 920 may be a near infrared ray (NIR) light emitting diode, and it includes a near infrared ray emission layer 922 for emitting light with a near infrared ray wavelength, and a first electrode 923 and a second electrode 921 formed at the top and the bottom of the near infrared ray emission layer 922.

The configurations and materials of the near infrared ray emission layer 922, the first electrode 923, and the second electrode 921 are the same as the near infrared ray emission layer 712, so no detailed description thereof will be provided.

The near infrared ray driving transistor 930 includes a gate electrode 931, a gate insulating layer 932, an electrode layer 9333, and an electrode insulating layer 934. The electrode layer 933 forms a first end or a second end of the near infrared ray driving transistor 930, and it may be connected to the second electrode 921 of the near infrared ray light emitter 920.

The near infrared ray sensor 940 includes a gate electrode 941, a gate insulating layer 942, an electrode layer 943, and an electrode insulating layer 944, and it may absorb and detect the near infrared rays 960 emitted by the near infrared ray emission layer 922 and reflected or scattered.

A detailed material and characteristic of the near infrared ray sensor 940 are the same as the near infrared ray sensor 630 according to the second aspect, so no detailed description thereof will be provided.

A black shield 915 is formed at the top of the OLED driving transistor 910, and a black shield 935 is formed at the top of the near infrared ray driving transistor 930 to thus shield the near infrared rays 960 emitted by the near infrared ray emission layer 922 and reflected or scattered.

The fingerprint recognition process using an OLED panel according to a second aspect of some example embodiments of the present inventive concepts corresponds to the fingerprint recognition process using an OLED panel according to a first aspect of some example embodiments of the present inventive concepts, so no detailed description thereof will be provided.

A structure and a characteristic of a visible light sensor according to some example embodiments of the present inventive concepts will now be described with reference to FIG. 6.

Figure 6A:
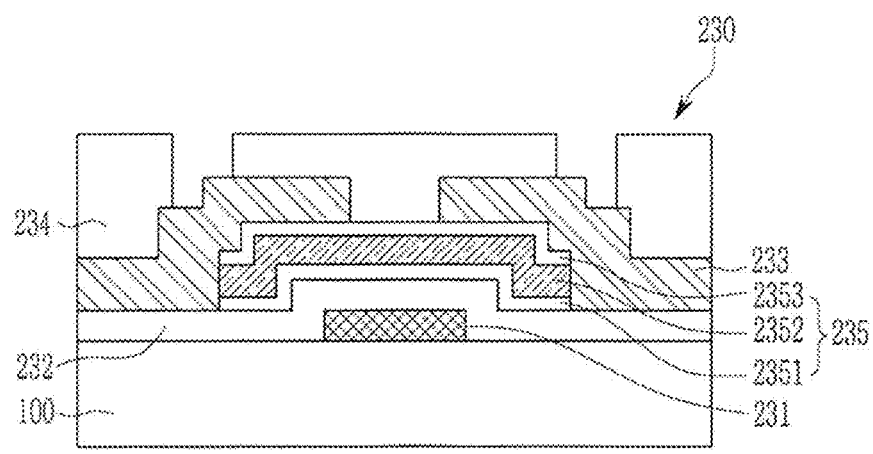
FIG. 6A shows a cross-sectional view of a visible light sensor according to some example embodiments of the present inventive concepts.
Figure 6B:
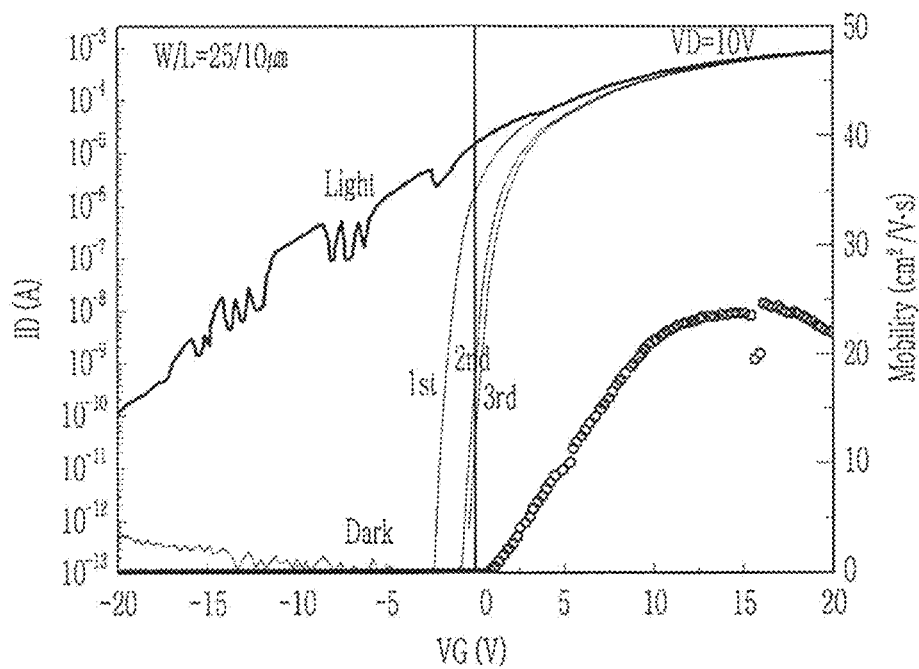
FIG. 6B shows a curved line showing a characteristic of a visible light sensor according to some example embodiments of the present inventive concepts.
Figure 6D:
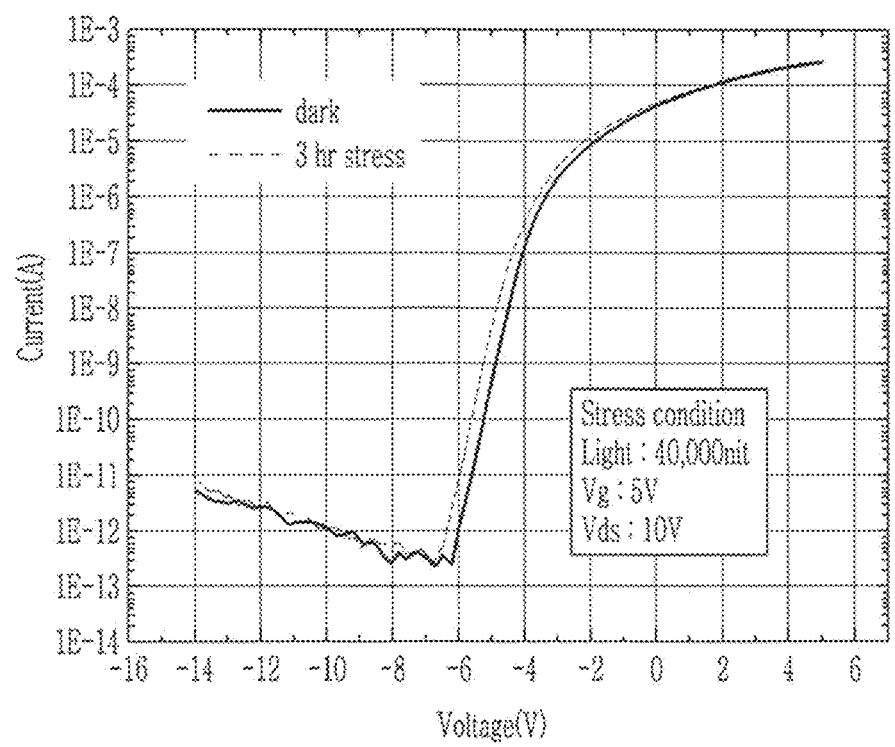
FIG. 6D shows a curved line showing a characteristic of an OLED driving transistor according to some example embodiments of the present inventive concepts.

FIG. 6A shows a cross-sectional view of a visible light sensor 230 according to some example embodiments of the present inventive concepts, and FIG. 6B shows a curved line showing a characteristic of a visible light sensor 230 according to some example embodiments of the present inventive concepts. FIG. 6C shows a curved line showing a characteristic of an OLED driving transistor according to some example embodiments of the present inventive concepts, and FIG. 6D shows a curved line showing a characteristic of an OLED driving transistor according to some example embodiments of the present inventive concepts.

The visible light sensor 230 includes a gate electrode 231 formed on a substrate 100, a gate insulating layer 232 formed on the gate electrode, a semiconductor layer 235 formed on the gate insulating layer, an electrode layer 233 formed on the semiconductor layer 235, and an electrode insulating layer 234 formed on the electrode layer.

The electrode layer 233 may be made of an aluminum-based metal such as aluminum (Al) or an aluminum alloy, a silver-based metal such as silver (Ag) or a silver alloy, a copper-based metal such as copper (Cu) or a copper alloy such as copper manganese (CuMn), a molybdenum-based metal such as molybdenum (Mo) or a molybdenum alloy, chromium (Cr), tantalum (Ta), and titanium (Ti).

The semiconductor layer 235 may be an oxide including at least one of zinc (Zn), indium (In), Ga (gallium), tin (Sn), and hafnium (Hf). For example, the semiconductor layer 235 may be formed of a bottom XIZO layer 2351, a ZIO layer 2352, and a top XIZO layer 2353. The thicknesses of the bottom XIZO layer 2351, the ZIO layer 2352, and the top XIZO layer 2353 may be one of (270 10, and 90) Å, (250, 10, and 90) Å, and (200, 20, and 80) Å, and the example embodiments are not limited thereto.

Referring to FIG. 6B, when the semiconductor layer 235 has no reflected or scattered visible light (330, refer to FIG. 2), it becomes that Vth0=−1.65V, and when the same absorbs the reflected or scattered visible light 330, it is given that Vth1=−0.05V, so it becomes that ΔVth=1.6V.

Therefore, regarding the driving voltage (−5V) in connection with the semiconductor layer 235, a current ratio flowing when there is visible light 330 compared to the case when there is no visible light 330 is $I_{ph,on}/I_{ph,off} > 10^6$, so the currents are different by $10^6$ times depending on whether there is absorbed visible light.

Referring to FIG. 6C, when a blue LED is used as a backlight, the current (Ids) generated when the semiconductor layer 635 absorbs blue (B) light is equal to or greater than $10^5$ times than the case (i.e., dark) when there is no visible light 330. Therefore, the fingerprint may be recognized with the blue color (B) from among the red R, green G, and blue B colors included in the visible light 330, thereby increasing selectivity of light.

Referring to FIG. 6D, when the stress is tested for three hours in the condition of Vg: 5V and Vds: 10 Vdml with luminance of 40,000 nit, the Vth shift is 0.1V which is very weak than the case (i.e., dark) when there is no visible light 330. Therefore, the Vth shift is very few at the LCD backlight level (10,00 nit)

A characteristic of photoelectric stability of the semiconductor layer 235 is acquired.

A structure and a characteristic of an OLED driving transistor according to some example embodiments of the present inventive concepts will now be described with reference to FIG. 7.

Figure 7A:
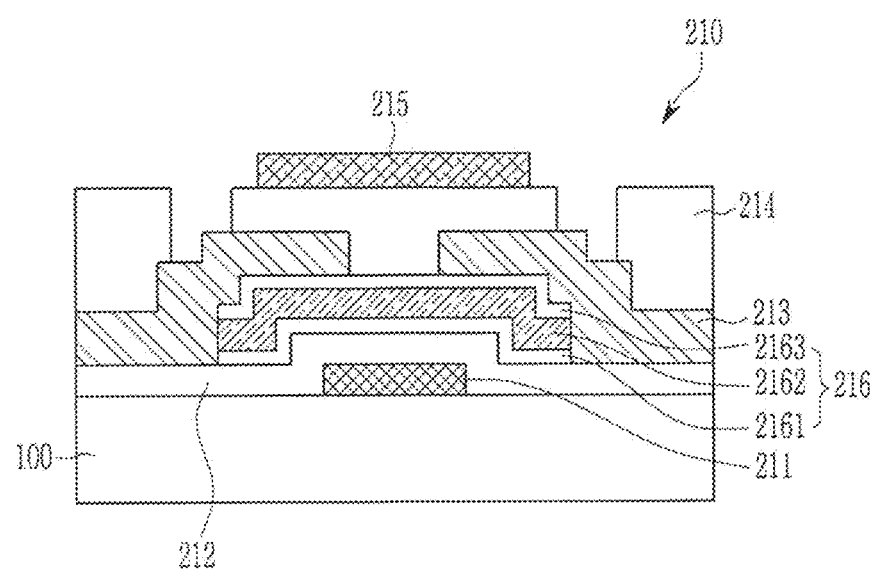
FIG. 7A shows a cross-sectional view of an OLED driving transistor according to some example embodiments of the present inventive concepts.
Figure 7B:
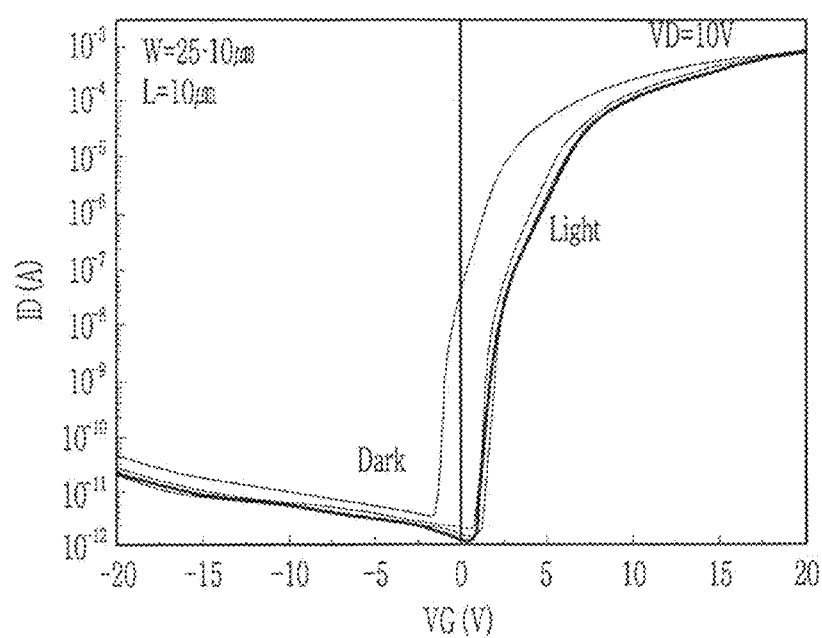
FIG. 7B shows a curved line showing a characteristic of an OLED driving transistor according to some example embodiments of the present inventive concepts.

FIG. 7A shows a cross-sectional view of an OLED driving transistor according to some example embodiments of the present inventive concepts, and FIG. 7B shows a curved line showing a characteristic of an OLED driving transistor according to some example embodiments of the present inventive concepts.

Referring to FIG. 7A, the OLED driving transistor 210 includes a gate electrode 211 formed on a substrate 100, a gate insulating layer 212 formed on the gate electrode, a semiconductor layer 216 formed on the gate insulating layer, an electrode layer 213 formed on the semiconductor layer, an electrode insulating layer 214 formed on the electrode layer, and a black shield 215 formed on the electrode insulating layer.

The semiconductor layer 216 may be an oxide including at least one of zinc (Zn), indium (In), Ga (gallium), tin (Sn), and hafnium (Hf). For example, the semiconductor layer 216 may be formed of a bottom XIZO layer 2161, a ZIO layer 2162, and a top XIZO layer 2163. The thicknesses of the bottom XIZO layer 2161, the ZIO layer 2162, and the top XIZO layer 2163 may be one of (270 10, and 90) Å, (250, 10, and 90) Å, and (200, 20, and 80) Å, and the example embodiments are not limited thereto.

The electrode layer 213 may be made of an aluminum-based metal such as aluminum (Al) or an aluminum alloy, a silver-based metal such as silver (Ag) or a silver alloy, a copper-based metal such as copper (Cu) or a copper alloy such as copper manganese (CuMn), a molybdenum-based metal such as molybdenum (Mo) or a molybdenum alloy, chromium (Cr), tantalum (Ta), and titanium (Ti).

The black shield 215 may be made of a molybdenum-based metal such as molybdenum (Mo) or a molybdenum alloy.

Referring to FIG. 7B, driving characteristics between the case (i.e., dark) when there is no visible light 330 and the case (i.e., light) when there is a visible light 330 have no difference because of the black shield 215.

Structures of a driver and an OLED light emitter according to some example embodiments of the present inventive concepts will now be described with reference to FIG. 8. FIG. 8 shows a driving circuit of a driver 200 and an OLED light emitter 300 according to some example embodiments of the present inventive concepts.

The driver 200 includes an OLED driving transistor 210, an OLED switching transistor 220, a visible light sensor 230, a visible light sensor switch transistor 250, and a capacitor $C_1$.

The OLED light emitter 300 includes an OLED 310.

The OLED driving transistor 210 includes a gate connected to a second end of the OLED switching transistor 220, a first end connected to a driving power unit (Vdd), and a second end connected to an anode of the OLED 310.

The OLED switching transistor 220 includes a gate connected to a gate line (n+1), a first end connected to a data line (Data), and a second end connected to the gate of the OLED driving transistor 210.

The capacitor $C_1$ is connected to the gate of the OLED driving transistor 210 and the anode of the OLED 310.

The visible light sensor 230 includes a gate connected to the gate line (n+1), a first end, and a second end connected to the first end of the visible light sensor switch transistor 250.

The visible light sensor switch transistor 250 includes a gate connected to a sensor line (s), a first end connected to the second end of the visible light sensor 230, and a second end connected to an output line (OutPut).

When a finger 400 is placed on the OLED panel 1000 at a first time, the OLED switching transistor 220 is turned on by an enable-level gate signal applied through a gate line (n+1), and the OLED driving transistor 610 is turned on by the data signal applied through the data line (Data) to store a data voltage corresponding to the data signal in the capacitor $C_1$, and a visible light 320 is discharged from the OLED 310 corresponding to the data voltage stored in the capacitor $C_1$ and is irradiated to the fingerprint of the finger 400.

A driver and an OLED light emitter according to some example embodiments of the present inventive concepts will now be described.

At a first time (or a previous time thereof), the visible light sensor switch transistor 250 is turned on by an enable-level signal applied through a sensor line (s), the visible light sensor 230 is turned on by an enable-level signal applied through a gate line (n), so as described with reference to FIG. 2B, the reflected or scattered visible light 330 is received in the visible light sensor 230 and a fingerprint is detected.

A configuration of a driver, a near infrared ray light emitter, and an OLED light emitter according to a first aspect of some example embodiments of the present inventive concepts will now be described with reference to FIG. 9. FIG. 9 shows a driving circuit of a driver 600, a near infrared ray light emitter 700, and an OLED light emitter 800 according to some example embodiments of the present inventive concepts.

The driver 600 includes an OLED driving transistor 610, a near infrared ray driving transistor 620, a near infrared ray sensor 630, an OLED switching transistor 652, a near infrared ray switching transistor 651, a near infrared ray sensor switching transistor 650, a capacitor $C_1$, and a capacitor $C_2$.

The near infrared ray light emitter 700 includes a near infrared ray OLED 710, and the OLED light emitter 800 includes a visible light OLED 310.

The OLED switching transistor 652 includes a gate connected to a gate line n+2, a first end, and a second end connected to the gate of the OLED driving transistor 610.

The OLED driving transistor 610 includes a gate connected to the second end of the OLED switching transistor 652, a first end connected to the driving power unit (Vdd), and a second end connected to the anode of the visible light OLED 310.

The capacitor $C_1$ is connected between the gate of the OLED driving transistor 610 and the anode of the visible light OLED 310.

The visible light OLED 310 includes an anode connected to the second end of the OLED driving transistor 610 and a cathode connected to a driving power unit (Vss).

The near infrared ray switching transistor 651 includes a gate connected to a gate line n+1, a first end, and a second end connected to the gate of the near infrared ray driving transistor 620.

The near infrared ray driving transistor 620 includes a gate connected to the second end of the near infrared ray switching transistor 651, a first end connected to the driving power unit (Vdd), and a second end connected to the anode of the near infrared ray OLED 710.

The capacitor C2 is connected between the gate of the near infrared ray driving transistor 620 and the anode of the near infrared ray OLED 310.

The near infrared ray OLED 710 is connected between the second end of the near infrared ray driving transistor 620 and the driving power unit (Vss).

The near infrared ray sensor switching transistor 650 includes a gate connected to a gate line (n), a first end, and a second end connected to the second end of the near infrared ray sensor 630.

The near infrared ray sensor 630 includes a gate connected to a sensor line (s), a first end connected to the second end of the near infrared ray sensor switching transistor 650, and a second end connected to the output line (OutPut).

A driving operation of a driver and a near infrared ray light emitter according to a first aspect of some example embodiments of the present inventive concepts will now be described.

When a finger (900, refer to FIG. 4B) is placed on the OLED panel 2000 at a first time, the near infrared ray switching transistor 651 is turned on by an enable-level gate signal applied through the gate line n+1, the near infrared ray driving transistor 620 is turned on by a data signal applied through a data line (Data), and a data voltage corresponding to the data signal is stored in the capacitor C2. The near infrared rays 720 is discharged from the near infrared ray OLED 710 corresponding to the data voltage stored in the capacitor C2 and is irradiated to the fingerprint of the finger 900.

At the first time (or a previous time thereof), the near infrared ray sensor switch transistor 650 is turned on by an enable-level signal applied through a sensor line (s), the near infrared ray sensor 630 is turned on by an enable-level signal applied through a gate line (n), and as described with reference to FIG. 4B, the reflected or scattered near infrared rays 730 is received in the near infrared ray sensor 630 and the fingerprint is detected.

After the first time, the OLED switching transistor 652 is turned on by an enable-level gate signal applied through a gate line n+2, the OLED driving transistor 610 is turned on by a data signal applied through a data line (Data), and a data voltage corresponding to the data signal is stored in the capacitor $C_1$. The visible light OLED 310 is discharged corresponding to the data voltage stored in the capacitor $C_1$ to this display an image.

The driving operation of the driver and the near infrared ray light emitter according to some example embodiments of the present inventive concepts corresponds to the driving operation of the driver and the near infrared ray light emitter according to some example embodiments of the present inventive concepts, so no detailed description thereof will be provided.

Figure 10:
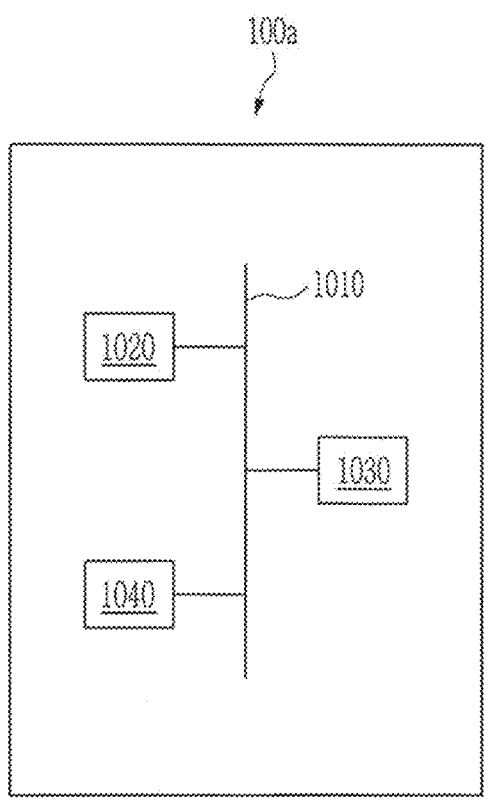

FIG. 10 is a schematic diagram of an electronic device 1002 according to some example embodiments.

As shown in FIG. 10, an electronic device 1002 may include a processor 1020, a memory 1030, and display device 1040 that are electrically coupled together via a bus 1010. The display device 1140 may be display device of any of the example embodiments as described herein, and thus may include any of the example embodiments of OLED panels as described herein. The memory 1030, which may be a non-transitory computer readable medium, may store a program of instructions. The processor 1020 may execute the stored program of instructions to perform one or more functions, including implementing the biometric recognition of an individual based on processing electrical signals received from the visible light sensor and/or near infrared ray sensor as described herein (e.g., to detect a fingerprint, an iris, or face image). The processor 1120 may be configured to generate an output (e.g., an image to be displayed on the display device, a command to operate a locking device, some combination thereof, or the like) based on implementing the biometric recognition.

While this inventive concepts have been described in connection with what is presently considered to be practical example embodiments, it is to be understood that the inventive concepts are not limited to the described example embodiments, but, on the contrary, is intended to cover various modifications and equivalent arrangements included within the spirit and scope of the appended claims.

What is claimed is:

1. An organic light emitting diode (OLED) panel, comprising:
   a substrate; and
   a pixel on the substrate, the pixel including
      a first OLED configured to emit a first light,
      a first sensor including an organic photodiode and configured to absorb and detect the first light reflected or scattered by a biometric object,
      a second OLED configured to emit a second light,
      a first OLED driving transistor configured to drive the first OLED, and
      a second OLED driving transistor configured to drive the second OLED,
   wherein the first OLED and the first sensor are on a same plane, and
   wherein at least one driving transistor of the first OLED driving transistor and second OLED driving transistor is between an OLED driven by the at least one driving transistor and the substrate.

2. The OLED panel of claim 1, wherein
the first light and the second light have different wavelengths.

3. The OLED panel of claim 1, the pixel further comprising
a first black shield on the first OLED driving transistor, a second black shield on the second OLED driving transistor, or a combination thereof.

4. The OLED panel of claim 1, wherein
a black shield is substantially not on the first sensor.

5. The OLED panel of claim 1, the pixel further comprising
a second sensor configured to absorb and detect the second light reflected or scattered by the biometric object.

6. The OLED panel of claim 1, the pixel further comprising
at least one OLED switching transistor on the substrate.

7. The OLED panel of claim 1, wherein
the organic photodiode comprises a material that is appropriate for absorbing the first light.

8. The OLED panel of claim 1, wherein
the pixel comprises a plurality of sub-pixels, the sub-pixels each configured to emit lights with different wavelengths, and
the first OLED and the first sensor are on the same plane in a sub-pixel.

9. The OLED panel of claim 1, wherein
the pixel comprises a plurality of sub-pixels, the sub-pixels each configured to emit lights with different wavelengths, and
the first OLED and the first sensor are on the same plane in each other sub-pixel.

10. The OLED panel of claim 1, wherein
each of the first OLED and the second OLED includes a first electrode and a second electrode, and
the first electrode includes a reflecting electrode, and the second electrode includes a transparent electrode or a semi-transparent electrode.

11. An electronic device comprising an Organic Light Emitting Diode (OLED) panel, the OLED panel comprising:
    a substrate; and
    a pixel on the substrate, the pixel including
       a first OLED configured to emit a first light,
       a first sensor including an organic photodiode and configured to absorb and detect the first light reflected or scattered by a biometric object,
       a second OLED configured to emit a second light,
       a first OLED driving transistor configured to drive the first OLED, and
       a second OLED driving transistor configured to drive the second OLED,
    wherein the first OLED and the first sensor are on a same plane, and
    wherein at least one driving transistor of the first OLED driving transistor and second OLED driving transistor is between an OLED driven by the at least one driving transistor and the substrate.

12. The electronic device of claim 11, wherein
the first light and the second light have different wavelengths.

13. The electronic device of claim 11, the pixel further comprising
a first black shield on the first OLED driving transistor, a second black shield on the second OLED driving transistor, or a combination thereof.

14. The electronic device of claim 11, wherein
a black shield is substantially not on the first sensor.

15. The electronic device of claim 11, the pixel further comprising
a second sensor configured to absorb and detect the second light reflected or scattered by the biometric object.

16. The electronic device of claim 11, the pixel further comprising
at least one OLED switching transistor on the substrate.

17. The electronic device of claim 11, wherein
the organic photodiode comprises a material that is appropriate for absorbing the first light.

18. The electronic device of claim 11, wherein
the pixel comprises a plurality of sub-pixels, the sub-pixels each configured to emit lights with different wavelengths, and
the first OLED and the first sensor are on the same plane in a sub-pixel.

19. The electronic device of claim 11, wherein
the pixel comprises a plurality of sub-pixels, the sub-pixels each configured to emit lights with different wavelengths, and
the first OLED and the first sensor are on the same plane in each other sub-pixel.

20. The electronic device of claim 11, wherein
each of the first OLED and the second OLED includes a first electrode and a second electrode, and
the first electrode includes a reflecting electrode, and the second electrode includes a transparent electrode or a semi-transparent electrode.

\* \* \* \* \*